United States Patent
Barraud et al.

(10) Patent No.: US 9,728,405 B2
(45) Date of Patent: Aug. 8, 2017

(54) NANOWIRE SEMICONDUCTOR DEVICE PARTIALLY SURROUNDED BY A GATE

(71) Applicant: COMMISSARIAT A L'ENERGIE ATOMIQUE ET AUX ENE ALT, Paris (FR)

(72) Inventors: Sylvain Barraud, Le Grand Lemps (FR); Pierrette Rivallin, Saint Martin d'uriage (FR); Pascal Scheiblin, Eybens (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 30 days.

(21) Appl. No.: 14/581,029

(22) Filed: Dec. 23, 2014

(65) Prior Publication Data
US 2015/0194489 A1  Jul. 9, 2015

(30) Foreign Application Priority Data
Jan. 7, 2014  (FR) ..................................... 14 50079

(51) Int. Cl.
H01L 29/78 (2006.01)
H01L 21/02 (2006.01)
(Continued)

(52) U.S. Cl.
CPC ........ *H01L 21/02603* (2013.01); *B82Y 10/00* (2013.01); *B82Y 40/00* (2013.01);
(Continued)

(58) Field of Classification Search
CPC  H01L 29/1037; H01L 29/785; H01L 29/0673
See application file for complete search history.

(56) References Cited

U.S. PATENT DOCUMENTS 6,709,982 B1   3/2004  Buynoski et al.
7,545,008 B2 *  6/2009  Chan ..................... H01L 21/845
                                                      257/350
(Continued)

FOREIGN PATENT DOCUMENTS

EP    2 043 141 A2    4/2009
WO   2005/041309 A1   5/2005
(Continued)

OTHER PUBLICATIONS

French Preliminary Search Report issued Sep. 3, 2014, in Patent Application No. FR 1450079, filed Jan. 7, 2014 (with English Translation of Category of Cited Documents).
(Continued)

*Primary Examiner* — Mark Prenty
(74) *Attorney, Agent, or Firm* — Oblon, McClelland, Maier & Neustadt, L.L.P.

(57) ABSTRACT

A semiconductor device is provided, including two semiconductor nanowires superimposed one on top of the other or arranged next to one another, spaced one from the other and forming channel regions of the semiconductor device, a dielectric structure entirely filling a space between the nanowires and which is in contact with the nanowires, a gate dielectric and a gate covering a first of the nanowires, sidewalls of the nanowires and sidewalls of the dielectric structure when the nanowires are superimposed one on top of the other, or covering a part of the upper faces of the nanowires and a part of an upper face of the dielectric structure when the nanowires are arranged next to one another, and wherein the dielectric structure comprises a portion of dielectric material with a relative permittivity greater than or equal to 20.

7 Claims, 14 Drawing Sheets

(51) Int. Cl.
| | |
|---|---|
| H01L 29/06 | (2006.01) |
| H01L 21/306 | (2006.01) |
| B82Y 10/00 | (2011.01) |
| B82Y 40/00 | (2011.01) |
| H01L 29/423 | (2006.01) |
| H01L 29/66 | (2006.01) |
| H01L 29/775 | (2006.01) |
| H01L 29/786 | (2006.01) |

(52) U.S. Cl.
CPC .. *H01L 21/02532* (2013.01); *H01L 21/30604* (2013.01); *H01L 29/0649* (2013.01); *H01L 29/0673* (2013.01); *H01L 29/42364* (2013.01); *H01L 29/42392* (2013.01); *H01L 29/66439* (2013.01); *H01L 29/66795* (2013.01); *H01L 29/775* (2013.01); *H01L 29/785* (2013.01); *H01L 29/78696* (2013.01)

(56) References Cited

U.S. PATENT DOCUMENTS

| | | | |
|---|---|---|---|
| 9,502,518 B2* | 11/2016 | Liu | H01L 29/42364 |
| 2007/0181947 A1 | 8/2007 | Ching Ho Chan et al. | |
| 2009/0101967 A1 | 4/2009 | Lai et al. | |
| 2010/0096619 A1 | 4/2010 | Cheong et al. | |
| 2014/0326955 A1 | 11/2014 | Barraud et al. | |

FOREIGN PATENT DOCUMENTS

| | | |
|---|---|---|
| WO | 2007/085996 A2 | 8/2007 |
| WO | WO 2008/059440 A2 | 5/2008 |

OTHER PUBLICATIONS

Yang-Kyu Choi et al., "Spacer FinFET: Nanoscale Double-gate CMOS Technology for the Terabit Era", Solid-State Electronics, vol. 46, 2002, pp. 1595-1601.

Yang-Kyu Choi et al., "A Spacer Patterning Technology for Nanoscale CMOS", IEEE Transactions on Electron Devices, vol. 49, No. 3, Mar. 2002, pp. 436-441.

L. K. Bera et al., "Three Dimensionally Stacked SiGe Nanowire Array and Gate-All-Around p-MOSFETs", Electron Devices Meeting, 2006, 4 pages.

T. Ernst et al., "Novel 3D Integration Process for Highly Scalable Nano-Beam Stacked-Channels GAA (NBG) FinFETs with $HfO_2$/TiN Gate Stack", IEDM, 2006, 4 pages.

K. Tachi et al., "Relationship Between Mobility and High-$k$ Interface Properties in Advanced Si and SiGe Nanowires", IEDM, 2009, 4 pages.

K. Tachi et al., "Transport Optimization with Width Dependence of 3D-stacked GAA Silicon Nanowire FET with High-$k$/Metal Gate Stack", Silicon Nano Worshop, 2009, 2 pages.

* cited by examiner

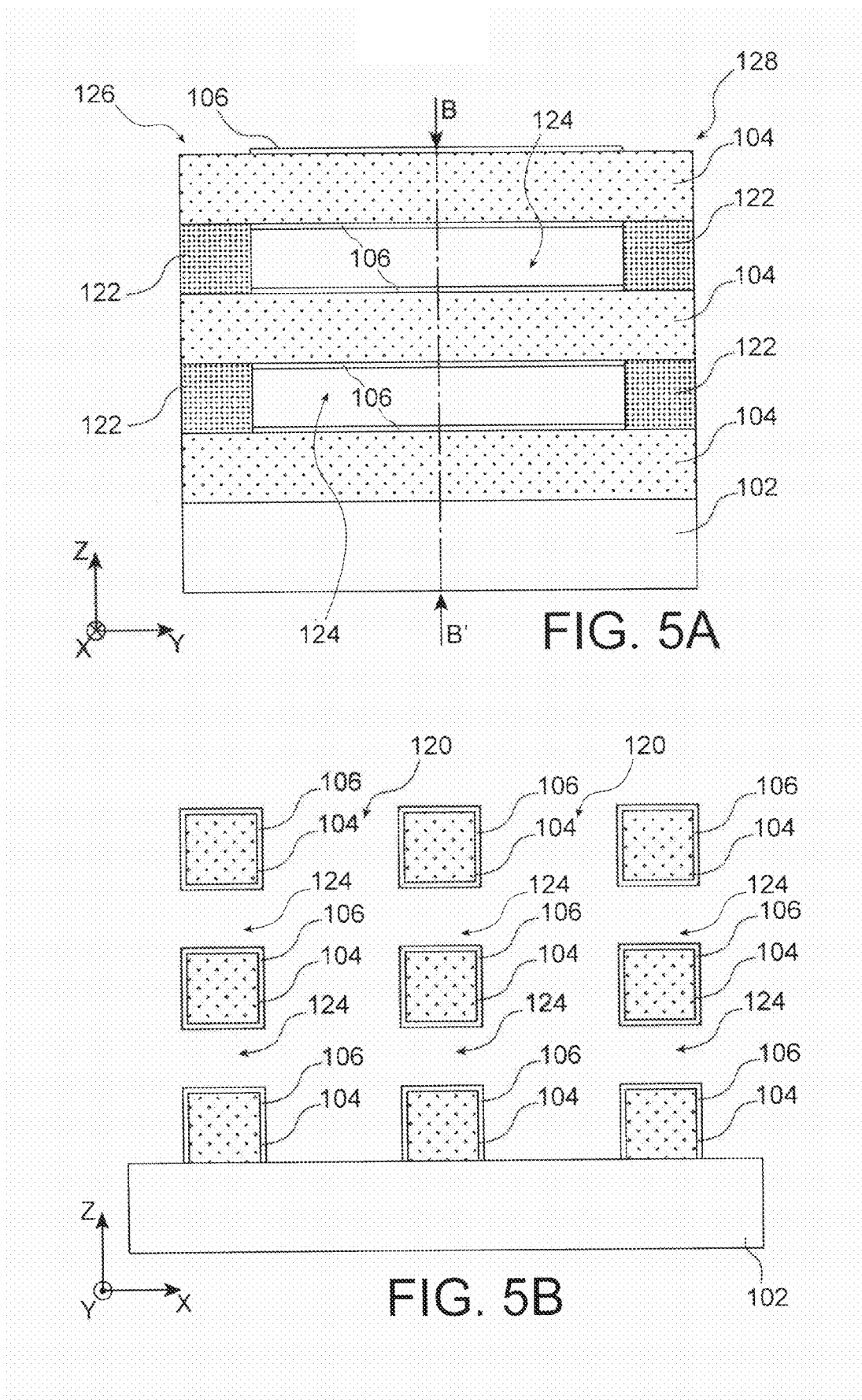

NANOWIRE SEMICONDUCTOR DEVICE PARTIALLY SURROUNDED BY A GATE

CROSS-REFERENCE TO RELATED APPLICATION

This application is based upon and claims the benefit of priority under 35 U.S.C. §119 from prior French Patent Application No. 14 50079, filed on Jan. 7, 2014, the entire content of which is incorporated herein by reference.

TECHNICAL FIELD AND PRIOR ART

A semiconductor device is described here comprising several semiconductor nanowires superimposed or arranged next to one another, spaced one from the other and which are partially surrounded by a gate. This advantageously applies to the carrying out of devices of the FET (Field Effect Transistor) type, in particular for high-performance and low-consumption logic applications in microelectronics. This also applies to the carrying out of MOSFET transistors with nanowires superimposed or arranged next to one another, for example for the carrying out of integrated circuits having improved electrical performance with respect to the circuits of prior art.

The semiconductor nanowires are nanostructures with which it is possible to carry out transistors of the FinFET ("Fin-shaped Field Effect Transistor", or 3D transistor) type. In such a FinFET transistor, instead of having one active zone corresponding to a planar structure as in a conventional MOSFET type transistor, a semiconductor "fin", or nanowire, is carried out in relief on the substrate in order to form the channel of the transistor. The interest of this adding is to increase, with no detriment to the density with which the transistors are carried out on the substrate, the contact surface between the gate and the channel on an upper face and the sidewalls of the channel (giving the name of "Tri-Gate transistor" also given for this type of transistor). This increase in the contact surface between the gate and the channel makes it possible to reduce leakage currents when the transistor is at the blocked state (OFF state). Such a FinFET structure as such makes it possible to carry out transistors comprising gate lengths that are shorter than those of planar architecture MOSFET transistors without degrading the electrical performance of the transistors. A FinFET transistor can be manufactured on a substrate of the bulk type or of the SOI type.

The threshold voltage obtained with such FinFET transistors is adjusted by the metal of the gate (set by its work output). The modulation of the threshold voltage made possible by an adjustment of the geometrical dimensions of the nanowire (width and height) remains however critical and may be incompatible with the constraints linked to good electrostatic control of the transistor, i.e. having a transistor with a low DIBL ("Drain-Induced Barrier Lowering") and a low slope under the threshold S ("Subthreshold Slope"). The conduction current obtained is directly linked to the circumference of the nanowire defined, in the case of a nanowire with rectangular section, via the value 2(H+W), with H corresponding to the height of the nanowire and W corresponding to the width of the nanowire.

With this type of transistor, it is possible to increase the nanowire, or fin, density, on the substrate, and therefore the density of the transistors, in order to create devices with better performance. The technique making it possible to increase the density of the nanowires is referred to as "spacer patterning" or "double patterning" (as it makes it possible to reduce the pitch of the nanowires by two) and consists in carrying out the nanowires via the following steps:

a first lithography and an etching are carried out in order to carry out patterns, drawn by a first mask, in a resin film, a depositing of a material referred to as "spacer" such as silicon oxide or silicon nitride is carried out on the patterns formed during the preceding step, a third step consists in etching the spacer and in removing the resin in such a way that the remaining spacer material defines new patterns on each side of each initial pattern defined during the first step. The pads formed as such are spacer pads of which the pitch is two times smaller than that of the pads formed during the first lithography, a fourth step of the method consists in transferring by etching, in the silicon layer, all of the patterns formed in the hard "spacer" mask, as such forming the silicon nanowires, a second lithography is often required in order to cut the nanowires at their ends, finally, the spacers are removed then the gate stack is deposited and etched.

Such a method is for example described in documents U.S. Pat. No. 6,709,982 B1 and WO 2008/059440 A2.

However, even with such a method, the circumference of the nanowires generally remains substantial and consequently, the electrostatic control is not optimal.

There are also transistors of the GAA-FET or "Gate-All-Around FET" type, wherein the gate entirely wraps, or surrounds, the silicon nanowire or nanowires. With respect to FinFET transistors, the semiconductor nanowires that have a gate that entirely wraps around the GAA-FET transistors make it possible to obtain an excellent electrostatic control of the transistors. This makes it possible in particular to reduce the leakage current when the transistor is in the OFF state (blocked). These devices of the GAA type are as such considered for the most advanced technological nodes for which the gate length is less than 20 nm.

However, a disadvantage of this type of transistor is its difficulty in terms of manufacture. Indeed, after the depositing of the gate all around the semiconductor nanowire or nanowires, it is necessary to etch the gate stack which can be comprised of an insulating layer (gate dielectric), of a gate metal and of polycrystalline silicon. However, after the etching of the gate stack, gate metal still remains to be suppressed, in particular under the nanowires in the source-drain extension zones. This removal is difficult to carry out but necessary in order to avoid short-circuiting the transistor. In order to avoid this problem, the gates are often oversized in order to partially overlap the source and drain zones and it is then difficult to reach the dimensions sought for the gate lengths of this type of transistor, for example less than 15 nm.

DISCLOSURE OF THE INVENTION

There is therefore a need to propose a semiconductor device that does not have the disadvantages linked to the carrying out of devices of the GAA-FET type while retaining the advantages provided by the structures of devices of the GAA-FET type with respect to other types of FET devices.

For this, a semiconductor device is proposed comprising at least:

two semiconductor nanowires superimposed one on top of the other, spaced one from the other and intended to form channel regions of the semiconductor device, a dielectric structure entirely filling a space extending between the two semiconductor nanowires and which is in contact with the two semiconductor nanowires, a gate dielectric and a gate covering at least a first of the two semiconductor nanowires, sidewalls of the two semiconductor nanowires and sidewalls of the dielectric structure, and wherein the dielectric structure comprises at least one portion of dielectric material with a relative permittivity greater than 3.9.

A semiconductor device is also proposed comprising at least:

two semiconductor nanowires superimposed one on top of the other or arranged next to one another, spaced one from the other and forming channel regions of the semiconductor device, a dielectric structure entirely filling a space extending between the two semiconductor nanowires and which is in contact with the two semiconductor nanowires, a gate dielectric and a gate covering at least a first of the two semiconductor nanowires, sidewalls of the two semiconductor nanowires and sidewalls of the dielectric structure when the two semiconductor nanowires are superimposed one on top of the other, or covering a part of the upper faces of the two semiconductor nanowires and a part of an upper face of the dielectric structure when the two semiconductor nanowires are arranged next to one another, and wherein the dielectric structure comprises at least one portion of dielectric material with a relative permittivity greater than or equal to 20.

With respect to a device of the GAA-FET type that comprises a gate dielectric and a gate entirely surrounding the nanowire or nanowires of the device and which therefore requires the implementing, when it is carried out, of an etching of a portion of the electrically conductive material of the gate located under the portions of the nanowire or of the nanowires that do not form the channel, in particular on source and drain extension zones, the semiconductor device described here comprises a dielectric structure with a strong permittivity interposed between the semiconductor nanowires which makes it possible to avoid the implementation of such an etching due to the fact that the gate surrounds only a portion of the nanowires and is not located under the nanowires. In addition, this semiconductor device does not require carrying out an over-sizing of the gates. As such, the gate dielectric and the gate of the semiconductor device may not cover, even partially, source and drain zones of the semiconductor device.

The semiconductor device described here makes it possible to form a transistor of the FET type that retains a structure close to that of a transistor of the FinFET type, i.e. with a channel region, here formed by at least two nanowires superimposed or arranged next to one another, and a gate arranged on two or three sides of the nanowires when the nanowires are superimposed or arranged on a part of the upper faces of the nanowires when the nanowires are arranged next to one another, facilitating the etching of the gate during the carrying out of it while still increasing the drain current and reducing the leakage current of the device via better electrostatic control. This semiconductor device makes it possible to retain the manufacturing simplicity of a FinFET transistor with the implementation of a standard gate etching while still retaining the advantages (in terms of charge transporting properties) of structures with gates surrounding GAA-FET devices. Due to the fact that the portion of dielectric material has a relative permittivity, or dielectric constant, greater than that of the $SiO_2$, i.e. greater than 3.9, the penetration of the electric field lines (with this field being induced by the gate located on the sidewalls of the nanowires during the operation of the semiconductor device) in the portion of dielectric material, and therefore under the semiconductor nanowires, is therefore favoured. This configuration makes it possible to obtain an electrostatic control close or even identical to that of Gate-All-Around (GAA) devices. The penetration of the electric field lines under the semiconductor nanowires also makes it possible to increase the conduction surface (with respect to a standard FinFET device) and therefore the electrical performance of the semiconductor device.

The term "dielectric structure" here designates a structure formed from one or several dielectric materials and not comprising any electrically conductive material or semiconductor such as a metal or polycrystalline silicon.

The dielectric structure, and in particular the portion of dielectric material, may extend between the nanowires at least at the channel region formed by the nanowires, and for example also at source and drain extension zones (LDD "Light-Doped Drain" and LDS "Light-Doped Source" regions).

The semiconductor device may form a field effect transistor of which the gate length is less than or equal to 20 nm, or 15 nm, or even 10 nm.

The semiconductor device may advantageously be used to carry out integrated circuits used to high-performance and low-consumption logical applications in microelectronics such as smartphones, tablets, portable PCs, etc.

When the semiconductor nanowires are arranged next to one another, the semiconductor device forms a planar structure which has for advantage to be easy to carry out. This planar structure furthermore improves the electrical performance of the device with respect to the devices of prior art as it makes it possible to have an electrical width that is more substantial, i.e. allow for the carrying out of nanowires of which the circumference is more substantial, which makes it possible to have better electrostatic control while still maintaining an occupation surface that is identical to the planar structures of the FDSOI type.

Such a planar structure allows for an improvement in the electrostatic control while still maintaining a fractioning of the total surface of the semiconductor present under the gate into nanowires with an electrical behaviour close to a 3D structure comprising stacked nanowires.

The portion of dielectric material may comprise at least one dielectric material with a relative permittivity greater than or equal to 20, or strictly greater than 20. As such, the penetration of the electric field lines in the dielectric structure is improved because the higher the dielectric constant, or relative permittivity, of this dielectric material is, the better the electrostatic coupling is.

When the two semiconductor nanowires are arranged one next to the other, a part of the dielectric structure may be arranged under the two semiconductor nanowires and between the two semiconductor nanowires. This portion of the dielectric structure may therefore be arranged on the side of the lower and lateral faces of the semiconductor nanowires. Only the upper face of the nanowires may be in contact with the gate.

The semiconductor nanowires may be parallel with respect to one another, i.e. extend according to the same direction.

In this case, each semiconductor nanowire may comprise, in a plane perpendicular to a direction according to which the semiconductor nanowires extend, a section of rectangular shape. The direction according to which the nanowires extend corresponds to the orientation of the largest dimension of the nanowires. In this configuration, the gate dielectric and the gate may cover an upper face of the first of the two semiconductor nanowires, as well as the lateral faces of the two semiconductor nanowires and the lateral faces of the dielectric structure. In addition, the portion of dielectric material and the dielectric structure may each comprise, in the plane perpendicular to the direction according to which the semiconductor nanowires extend, a section of rectangular shape. Alternatively, it is possible that the section of the semiconductor nanowires, in the plane perpendicular to the direction according to which the semiconductor nanowires extend, be circular. In addition, the portion of dielectric material and the dielectric structure may each comprise, in the plane perpendicular to the direction according to which the semiconductor nanowires extend, a section of circular shape.

Each semiconductor nanowire may be surrounded by a dielectric interface layer, with the dielectric structure able to further comprise portions of the dielectric interface layers arranged between the semiconductor nanowires and in contact with the portion of dielectric material. In the absence of such dielectric interface layers, the portion of dielectric material may be directly in contact with the semiconductor nanowires.

In the dielectric structure, the thickness of the portion of dielectric material may be greater than or equal to about ten times the thickness of a dielectric interface layer.

The semiconductor device may further comprise, when the semiconductor device comprises more than two semiconductor nanowires superimposed one on top of the other, several dielectric structures such that two of the adjacent semiconductor nanowires may be spaced one from the other by one of the dielectric structures extending between said two adjacent semiconductor nanowires and which is in contact with said two adjacent semiconductor nanowires, and the gate dielectric and the gate may also cover sidewalls of each of the semiconductor nanowires and sidewalls of each of the dielectric structures.

The semiconductor device may further comprise source and drain regions between which extend the semiconductor nanowires or formed by parts of the semiconductor nanowires, with the dielectric structure able to be in contact with the source and drain regions and/or juxtaposed with the source and drain regions.

A method for carrying out a semiconductor device is also proposed, comprising at least the steps of:
  carrying out at least two semiconductor nanowires superimposed one on top of the other, spaced one from the other and intended to form channel regions of the semiconductor device,
  carrying out at least one dielectric structure entirely filling a space extending between the two semiconductor nanowires and which is in contact with the two semiconductor nanowires,
  carrying out a gate dielectric and a gate covering at least a first of the two semiconductor nanowires, sidewalls of the two semiconductor nanowires and sidewalls of the dielectric structure,
  and wherein the dielectric structure comprises at least one portion of dielectric material with a relative permittivity greater than 3.9.

A method for carrying out a semiconductor device is also proposed, comprising at least the steps of:
  carrying out at least two semiconductor nanowires superimposed one on top of the other or arranged next to one another, spaced one from the other and forming channel regions of the semiconductor device,
  carrying out of at least one dielectric structure entirely filling a space extending between the two semiconductor nanowires and which is in contact with the two semiconductor nanowires,
  carrying out a gate dielectric and a gate covering at least a first of the two semiconductor nanowires, sidewalls of the two semiconductor nanowires and sidewalls of the dielectric structure when the two semiconductor nanowires are superimposed one on top of the other, or covering a part of the upper faces of the two semiconductor nanowires and a part of an upper face of the dielectric structure when the two semiconductor nanowires are arranged next to one another,
  and wherein the dielectric structure comprises at least one portion of dielectric material with a relative permittivity greater than or equal to 20.

When the two semiconductor nanowires are superimposed one on top of the other, the carrying out of the two semiconductor nanowires may comprise at least the implementation of the steps of:
  etching of a stack of at least two semiconductor layers between which is arranged at least one sacrificial layer, such that remaining portions of the two semiconductor layers correspond to the semiconductor nanowires, with a remaining portion of the sacrificial layer being arranged between the semiconductor nanowires,
  removal of the remaining portion of the sacrificial layer arranged between the semiconductor nanowires, forming the space extending between the two semiconductor nanowires.

The two semiconductor layers may comprise silicon, and the sacrificial layer may comprise SiGe.

When the two semiconductor nanowires are arranged next to one another, the carrying out of the two semiconductor nanowires may comprise at least the implementation of the steps of:
  etching a semiconductor layer arranged on a sacrificial layer, forming the space extending between the two semiconductor nanowires and such that remaining portions of the semiconductor layer correspond to the semiconductor nanowires,
  removal of the sacrificial layer arranged under the semiconductor nanowires.

A part of the dielectric structure may be carried out under the two semiconductor nanowires and between the two semiconductor nanowires.

The step of carrying out the dielectric structure may comprise at least one depositing of the portion of dielectric material between the semiconductor nanowires.

The step of carrying out the dielectric structure may further comprise, between the step of carrying out of the two semiconductor nanowires and the step of depositing of the portion of dielectric material, a step of carrying out an dielectric interface layer around each semiconductor nanowire, the portion of dielectric material then being deposited against the parts of the dielectric interface layers arranged between the semiconductor nanowires.

The method may further comprise the carrying out of source and drain regions between which extend the semiconductor nanowires or formed by portions of semiconductor nanowires, with the dielectric structure able to be carried out in contact with the source and drain regions and/or juxtaposed with the source and drain regions.

BRIEF DESCRIPTION OF THE DRAWINGS

This invention shall be better understood when reading the description of example embodiments provided solely for the purposes of information and in no way restricted, in reference to the annexed drawings wherein:

FIGS. 2 to 6B show the steps of a method for carrying out several semiconductor devices according to the first embodiment.

Identical, similar or equivalent portions of the various figures described hereinafter bear the same numerical references so as to facilitate moving from one figure to another.

The different portions represented in the figures are not necessarily represented according to a uniform scale, in order to make the figures easier to read.

The various possibilities (alternatives and embodiments) must be understood as not being exclusive from one another and can be combined together.

DETAILED DISCLOSURE OF PARTICULAR EMBODIMENTS

Figure 1:
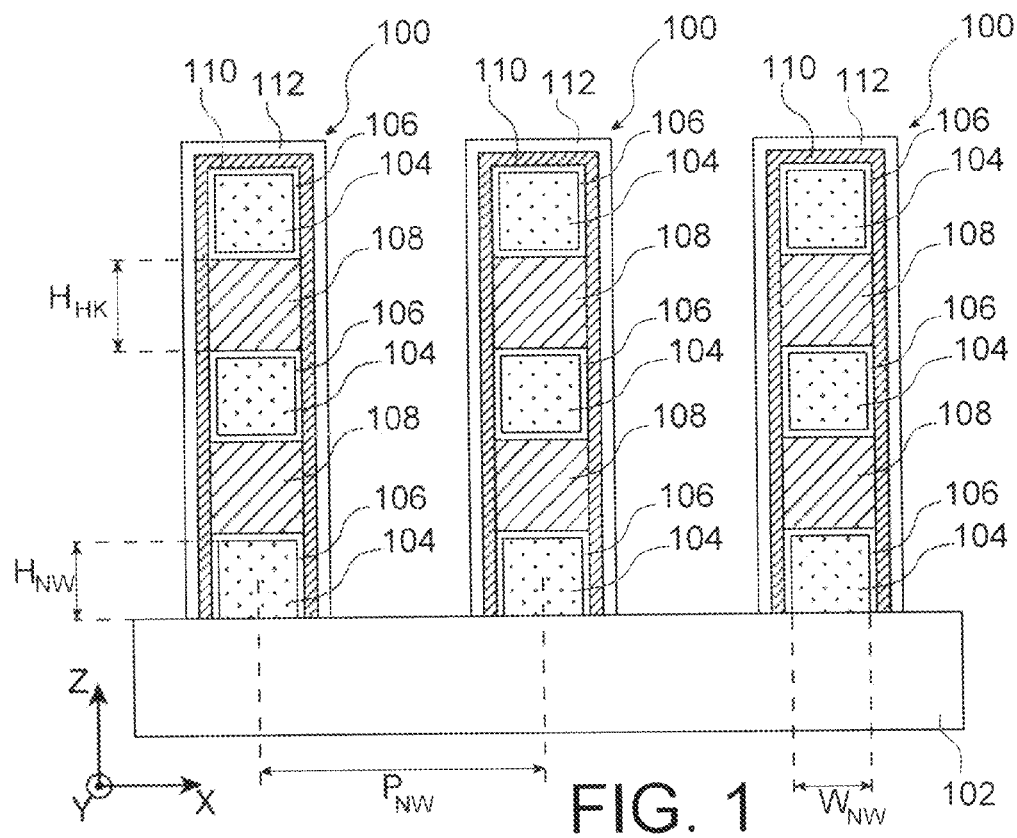
FIG. 1 shows a front cross-section view of several semiconductor devices according to a first embodiment.

Reference is first made to FIG. 1 which shows a front cross-section view of several semiconductor devices 100 according to a first embodiment. In this first embodiment, each one of the semiconductor devices 100 corresponds to an FET type transistor with superimposed nanowires.

The semiconductor devices 100 are carried out on a dielectric layer 102 for example comprising an oxide semiconductor such as $SiO_2$. This dielectric layer 102 can itself be arranged on a bulk semiconductor substrate (not shown), for example comprising silicon, or correspond to a buried dielectric layer of a substrate of the semiconductor on insulator type, forming for example a BOX (buried oxide) of an SOI (silicon on insulator) substrate. In the first embodiment described here, the dielectric layer 102 is a thick dielectric layer, with its thickness (dimension according to the axis Z shown in FIG. 1) being for example equal to about 145 nm.

Each one of the semiconductor devices 100 comprises several semiconductor nanowires 104 (at least two), for example comprising silicon and/or germanium and/or any III-V semiconductor, superimposed one on top of the other and spaced from one another by dielectric structures formed of one or several dielectric materials. In the embodiment shown in FIG. 1, each of the semiconductor devices 100 comprises three semiconductor nanowires 104. Alternatively, each of the semiconductor devices 100 can comprise two nanowires, or four nanowires, or more than four nanowires, superimposed one on top of the other. The parties of the semiconductor nanowires 104 shown in FIG. 1 form channels of the semiconductor devices 100 which extend between source and drain regions (cannot be seen in FIG. 1) of the semiconductor devices 100, parallel to the Y axis.

In the embodiment described here, the sections of semiconductor nanowires 104 in the plane (X, Z), i.e. in a plane perpendicular to the direction (parallel to the Y axis) according to which the semiconductor nanowires 104 extend, are of square shape. However, these sections could be of a different shape, for example rectangular or circular. Each one of the semiconductor nanowires 104 has a height $H_{NW}$, or thickness, that corresponds to the dimension according to the axis Z shown in FIG. 1, for example equal to about 10 nm or 12 nm, or more generally between about 5 nm and 30 nm. Each one of the semiconductor nanowires 104 has a width $W_{NW}$, that corresponds to the dimension according to the X axis shown in FIG. 1, for example equal to about 10 nm or 12 nm, or more generally between about 5 nm and 30 nm. Each one of the semiconductor nanowires 104 can also have a length $L_{NW}$, that corresponds to the dimension according to the Y axis shown in FIG. 1, for example between about 5 nm and several hundreds of nanometers. The centres of two adjacent semiconductor nanowires 104 that are in the same plane parallel to the surface of the dielectric layer 102 whereon are carried out the semiconductor devices 100 (parallel to the plane (X, Y)) and which belong to two adjacent devices 100 are spaced by a distance $P_{NW}$ for example equal to about 30 nm (with the space separating these two semiconductor nanowires 104 being for example equal to about 20 nm), or more generally between about 15 nm and several hundred nanometers.

In this first embodiment, each of the semiconductor nanowires 104 is surrounded by a dielectric interface layer 106, for example comprising $SiO_2$ (with relative permittivity equal to 3.9) and a thickness equal to about 0.8 nm or between about 0.7 nm and 10 nm. These dielectric interface layers are here in direct contact with the semiconductor nanowires 104. These dielectric interface layers 106 make it possible to reduce the interface defects and as such to obtain better transporting properties in the semiconductor structure. These interface layers 106 are for example carried out as finely as possible in order to retain an excellent electrostatic coupling, for example with a thickness less than or equal to about 2 nm.

In each of the semiconductor devices 100, portions of dielectric material 108 are arranged between the semiconductor nanowires 104, with each one of the portions of dielectric material 108 being in contact with the dielectric interface layers 106 surrounding the semiconductor nanowires 104 between which is located the portion of dielectric material 108. As such, in each of the semiconductor devices 100, the space between two nanowires 104 superimposed one on top of the other is entirely filled with a dielectric structure formed of the portions of the dielectric interface layers 106 surrounding each one of these two semiconductor nanowires 104 and located between these two semiconductor nanowires 104 as well as by one of the portions of dielectric material 108 in contact with these portions of dielectric interface layers 106.

In the embodiment described here, the sections of the portions of dielectric material 108 in the plane (X, Z), i.e. in a plane perpendicular to the direction (parallel to the Y axis) according to which the semiconductor nanowires 104 extend, are of square or rectangular shape. The shape of these sections can however be different as it depends in particular on those of the semiconductor nanowires 104 (and therefore also on those of the dielectric interface layers 106) due to the fact that the portions of dielectric material 108 are carried out by entirely filling the space located between the semiconductor nanowires 104 surrounded by the dielectric interface layers 106. Each of the dielectric portions 108 has a height $H_{HK}$, or thickness, corresponding to the dimension according to the axis Z shown in FIG. 1, for example equal to about 12 nm, or more generally between about 5 nm and several tens of nanometers. Each one of the portions of dielectric material 108 here has a width, corresponding to the dimension according to the axis X shown in FIG. 1, equal to the sum of the width $W_{NW}$ of one of the semiconductor nanowires 104 and twice the thickness of one of the dielectric interface layers 106, and for example equal to about 11.6 nm, or between about ($W_{NW}$+2(thickness of one of the layers 106)) and ($W_{NW}$−6 nm). Alternatively, one or several or each one of the portions of dielectric material 108 can have a width less than $W_{NW}$ of a few nanometers, by carrying out for example a slight "recess", or indentation, of the sidewalls of the portions 108, which makes it possible to further improve the electrostatic control of the device.

Each one of the portions of dielectric material 108 can also have a length, corresponding to the dimension according to the axis Y shown in FIG. 1, for example between equal to $L_G$±10 nm, with $L_G$ corresponding to the gate length of the device, which makes it possible to retain this material with a strong permittivity under the gate of the device, i.e. of the FET transistor carried out. The centres of two adjacent portions of dielectric material 108 located in a same plane parallel to the surface of the dielectric layer 102 whereon are carried out the semiconductor devices 100 (parallel to the plane (X, Y)) and which belong to two adjacent semiconductor devices 100 are spaced by the distance $P_{NW}$.

The portions of dielectric material 108 comprise a dielectric material with a strong relative permittivity, i.e. with a relative permittivity greater than that of $SiO_2$ which is equal to 3.9, for example $TiO_2$ ($\in_R$=80) and/or $HfO_2$ ($\in_R$=25) and/or $ZrO_2$ ($\in_R$=25) and/or $Ta_2O_5$ ($\in_R$=22) and/or $Al_2O_3$ ($\in_R$=9) and/or $Si_3N_4$ ($\in_R$=7) and/or HfSiON ($\in_R$=20) and/or SrTiO3 ($\in_R$=2000) and/or $Y_2O_3$ ($\in_R$=15). Advantageously, the dielectric material of the portions 108 is chosen from among those of which the relative permittivity is between about 20 and 80. As such, in similar environmental conditions, the relative permittivity of the dielectric material of the portions 108 is greater than that of $SiO_2$. Other materials of the piezoelectric type of which dielectric permittivity is high (for example PZT of which the permittivity is between 200 and 4000, or $BaTiO_3$ of which the permittivity is equal to about 1700) can be used.

The semiconductor nanowires 104, surrounded with dielectric interface layers 106, and the dielectric portions 108 form, for each of the semiconductor devices 100, an alternating stack of semiconductor nanowires and of dielectric structures. These stacks are covered by gate dielectrics 110. In each of the devices 100, the gate dielectric 110 covers the sidewalls of the stack, i.e. the sidewalls of the portions of dielectric material 108 as well as the portions of the dielectric interface layers 106 covering the sidewalls of the semiconductor nanowires 104. Each gate dielectric 110 further covers a first of the semiconductor nanowires 104 of each stack, i.e. an upper face of the stack formed here by the portion of the dielectric interface layer 106 covering the upper face of the first semiconductor nanowire 104 (i.e. the semiconductor nanowire 104 located above the or other semiconductor nanowires 104 of the semiconductor device 100). The gate dielectrics 110 correspond to layers of dielectric material with a strong relative permittivity (greater than 3.9), for example comprising $HfO_2$ and a thickness equal to about 2.5 nm.

Each one of the gate dielectrics 110 is covered by an electrically conductive gate 112, for example comprising metal, corresponding here to a layer of TiN of a thickness for example equal to about 5 nm.

Each one of the semiconductor devices 100 thus forms an FET transistor of which the channel is formed by superimposed semiconductor nanowires 104 and of which the gate 112 covers two or three sides of each one of the semiconductor nanowires 104, with the other side of the semiconductor nanowires 104 that are not covered by the gate 112 and the gate dielectric 110 being in contact with the dielectric structures which comprise the portions of dielectric material 108 with strong dielectric permittivity. This strong dielectric permittivity of the portions of dielectric material 108 favours the penetration of the electric field lines (which is induced, during the operation of the device 100, by the gate 112 located on the sidewalls of the semiconductor nanowires 104) in the portions of dielectric material 108, and therefore between the semiconductor nanowires 104 forming the channels, which makes it possible to increase the drain current and to reduce the leakage current via better electrostatic control of the transistors formed by the semiconductor devices 100 which is close or identical to that of GAA-FET transistors. With respect to a transistor of the FinFET type, the penetration of the electric field lines between the semiconductor nanowires 104 also make it possible to increase the conduction surface, and therefore the performance of the transistor formed by the semiconductor device 100. This structure also provides other advantages linked to the method of carrying out the semiconductor device 100 which are described hereinafter.

In addition, although they cannot be seen in FIG. 1, the semiconductor devices 100 also comprise source and drain regions between which extend the semiconductor nanowires 104. Source and drain extension zones formed by the ends of the semiconductor nanowires 104 are also in contact with the portions of dielectric material 108 and therefore are not entirely surrounded by the gate 112 and the gate dielectric 110. In addition, the portions of dielectric material 108 are juxtaposed with the source and drain regions. Alternatively, it is also possible that the portions of dielectric material 108 be arranged immediately under the gate and that they not extend in the source and drain regions.

According to an alternative of the first embodiment described hereinabove, it is possible for at least one portion of each one of the semiconductor nanowires 104 or of some of the semiconductor nanowires 104 to not be surrounded by the dielectric interface layers 106. In such an alternative, one of the portions of dielectric material 108 is directly in contact with the two semiconductor nanowires 104 between which this portion of dielectric material 108 is arranged. In addition, in this configuration, the gate dielectric 110 is also in direct contact with the sidewalls of the semiconductor nanowires 104. According to this alternative, the width of at least one or of each one of the portions of dielectric material 108 can be equal to the width $W_{NW}$ of each one of the semiconductor nanowires 104 between which are located the portion of dielectric material 108.

According to a second alternative, it is possible for the width (dimension according to the X axis) of at least one or of each one of the portions of dielectric material 108 to be less than that of each one of the semiconductor nanowires 104 between which are located the portion of dielectric material 108 or, when the semiconductor nanowires 104 are surrounded by the dielectric interface layers 106, less than the sum of the width of one of the semiconductor nanowires 104 and twice the thickness of one of the dielectric interface layers 106. According to this configuration, the sidewalls of the stacks of the semiconductor nanowires 104, of the dielectric interface layers 106 and of the portions of dielectric material 108 comprise hollows on portions of dielectric material 108. This difference in width is for example between 0 and 6 nm and makes it possible to favour a little further the electrostatic control in such a semiconductor device 100. This difference in width is for example equal to about 3 nm. According to this second alternative, the width $W_{NW}$ of each semiconductor nanowire 104 is for example between about 5 nm and 10 nm, and the height $H_{HK}$ of each portion of dielectric material 108 is for example between about 10 nm and 20 nm. The height $H_{NW}$ of each semiconductor nanowire 104 is for example equal to 12 nm. In this configuration, the gate dielectric 110 and the gate 112 can be located in one part only of the total space located between two nanowires 104 superimposed one on top of the other, i.e. at the hollows formed by the portions of dielectric material 108 on sidewalls of the stacks of the semiconductor nanowires 104 and of the dielectric structures.

Whether the widths of the portions of dielectric material 108 are equal to or less than those of the semiconductor nanowires 104, the semiconductor nanowires 104 and the portions of dielectric material 108 of a semiconductor device 100 can be carried out such that the concentrations in electrons on upper and lower faces of each nanowire 104 (corresponding to the faces of the nanowires 104 which are parallel to the surface of the layer 102 whereon the semiconductor devices 100 are carried out) are equal to or close to one another, for example such that their ratio R is at least equal to about 0.8. This ratio R, which depends on the parameters of the nanowires 104 and of the dielectric portion 108 of the semiconductor device 100, can be evaluated according to the following equation:

$R = 0.53933 + 0.030552 \cdot \in_R + 147.59613 \cdot B - 160.12808 \cdot W_{NW} + 16.6 \cdot H_{HK} - 1.3622 \cdot \in_R \cdot B + 0.6426 \cdot \in_R \cdot W_{NW} + 0.15974 \cdot \in_R \cdot \mu H_{HK} - 10868 \cdot B \cdot W_{NW} - 1229.455 \cdot B \cdot H_{HK} + 1748.2777 \cdot W_{NW} \cdot H_{HK} - 5.6531 \cdot 10^{-4} \cdot \in_R^2 + 6744.84 \cdot W_{NW}^2 - 807.16 \cdot H_{HK}^2 + 167.3184 \cdot \in_R \cdot B \cdot W_{NW} + 0.012275 \cdot \in_R^2 \cdot W_{NW}$ with $\in_R$: relative permittivity of the dielectric material of the portions 108, B: difference between the width of one of the nanowires 104 and the width of one of the portions of dielectric material 108.

Figure 7:
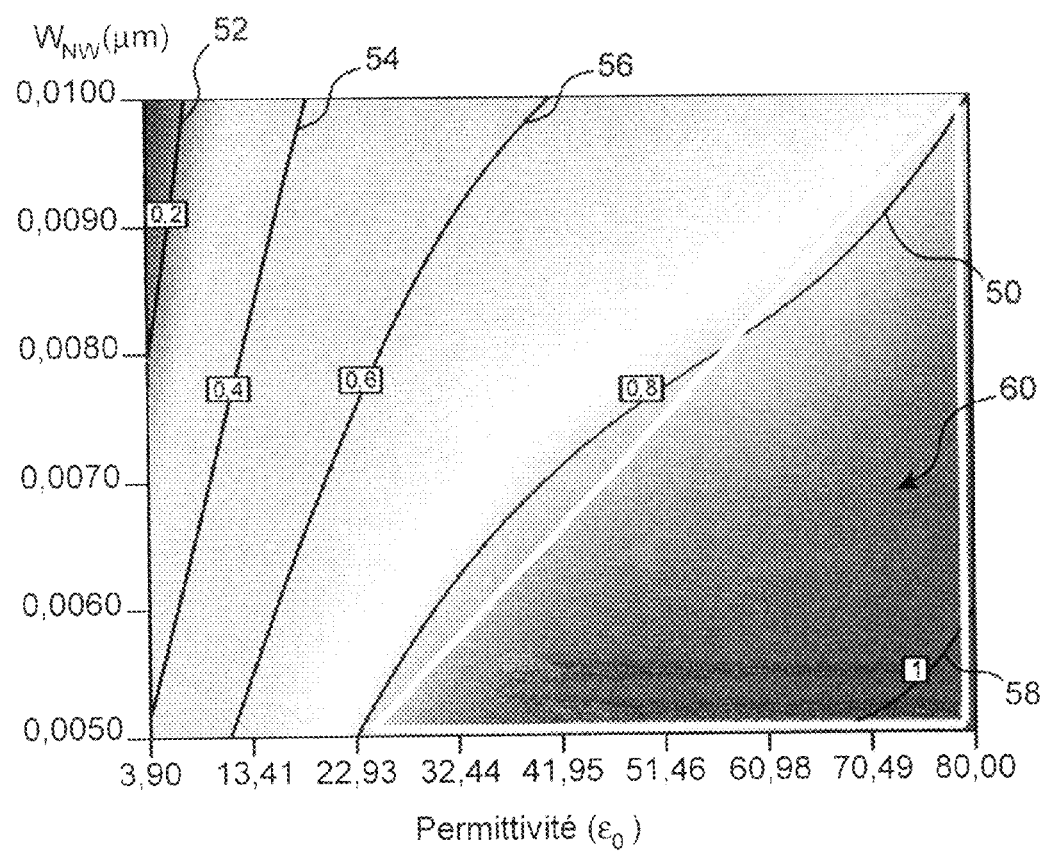
FIG. 7 shows the values of the ratio of the concentrations in electrons on the upper and lower faces of a semiconductor nanowire of a semiconductor device according to the relative permittivity of a portion of dielectric material of the semiconductor device and of the width of the semiconductor nanowire.

The curves shown in FIG. 7 correspond to the values of the ratio R according to the value of $\in_R$ (in abscissa), which is here between 3.9 and 80 $\in_0$, and the value of $W_{NW}$ (in ordinate), which is here between 0.005 μm and 0.01 μm, by choosing B=3 nm and $H_{HK}$=20 nm. The curve bearing the reference 50 corresponds to the pairs of values ($\in_R$; $W_{NW}$) making it possible to have a ratio R of value equal to 0.8. Likewise, the curves references as 52, 54, 56 and 58 correspond to the pairs of values ($\in_R$; $W_{NW}$) making it possible to have a ratio R of a value respectively equal to 0.2, 0.4, 0.6 and 1. As such, in order to carry out a semiconductor device 100 that has a ratio R greater than 0.8, the values of $\in_R$ and of $W_{NW}$ can be chosen in the zone 60 located to the right of the curve 50 and which corresponds to the pairs of values ($\in_R$; $W_{NW}$) making it possible to reach a ratio R greater than or equal to 0.8.

This FIG. 7 shows that the finer the structure of the semiconductor nanowires 104 is, i.e. the smaller the value of $W_{NW}$ is (for example equal to 5 nm), the more the dielectric material used for carrying out the portions 108 can be chosen with a low dielectric permittivity (for example HfO$_2$ of which the relative permittivity is equal to about 25 when $W_{NW}$=5 nm). Likewise, the more substantial the structure of the semiconductor nanowires 104 is, i.e. the higher the value of $W_{NW}$ is (for example equal to 10 nm), the more the dielectric material used to carry out the portions 108 can be chosen with a higher dielectric permittivity (for example TiO$_2$ of which the relative permittivity is equal to about 80 when $W_{NW}$=10 nm).

With such a ratio R close to 1 or between about 0.8 and 1, the electric potential obtained in the semiconductor nanowires 104 during the operation of the semiconductor device 100 is relatively homogeneous, i.e. the electric potential on the upper and lower faces of the semiconductor nanowires 104 is practically equivalent to that on the lateral faces of the semiconductor nanowires 104 which are covered by the gate dielectric 110 and the gate 112 of the semiconductor device 100.

It is possible for several semiconductor devices 100 carried out on the same layer or a same substrate to form a single device of the FET type. In this case, the source and drain regions of these devices 100 are common, i.e. electrically connected together for example by unifying them such that they correspond to a single source region and to a single drain region, and the gates of these devices 100 are also common such as the device obtained comprises only one gate.

In relation with FIGS. 2 to 6B, the steps will now be described of a method of carrying out semiconductor devices 100 described hereinabove.

Figure 2:
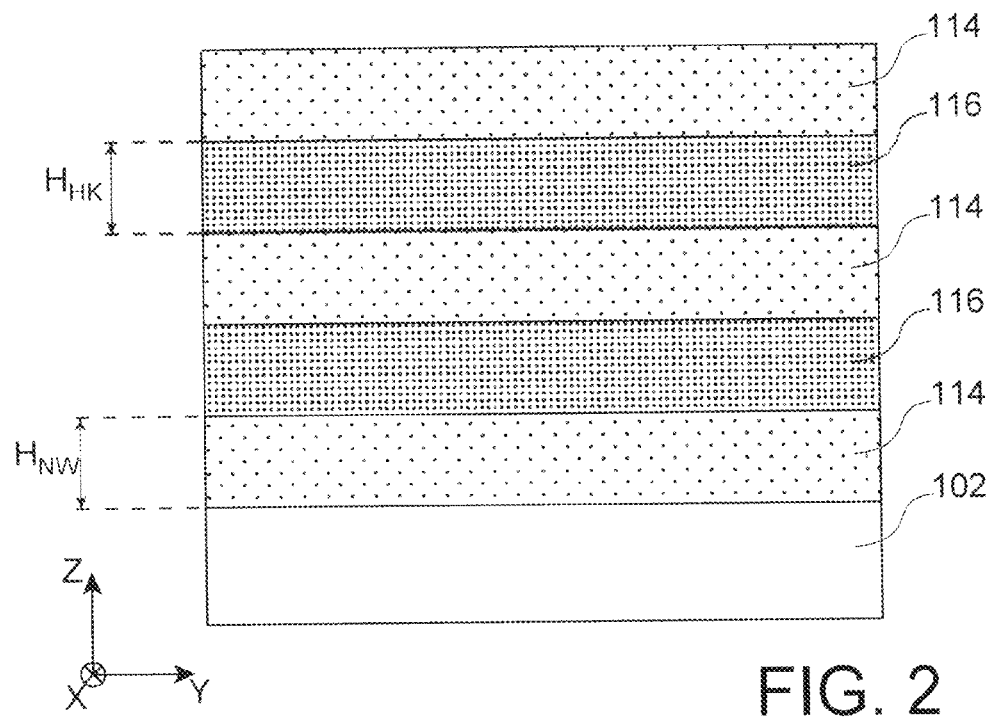

A stack of several layers is first of all carried out in order to form the semiconductor nanowires 104 (see FIG. 2 corresponding to a profile cross-section view of this stack). This stack of layers rests on a support corresponding here to the dielectric layer 102. Several semiconductor layers 114 intended for the carrying out of semiconductor nanowires 104 are arranged on the dielectric layer 102. The material of the semiconductor layers 114 corresponds to that of the semiconductor nanowires 104 intended to be carried out, i.e. for example of the silicon and/or of the germanium and/or any semiconductor of the III-V type. The number of these stacked semiconductor layers 114 corresponds to the number of superimposed semiconductor nanowires 104 that each semiconductor device 100 is intended to comprise (three in the example described here). In addition, the thickness of these semiconductor layers 114 (dimension according to the axis Z) is here equal to the height, or the thickness, $H_{NW}$ desired for the semiconductor nanowires 104. Due to the fact that within each semiconductor device 100 the superimposed semiconductor nanowires 104 are also spaced from one another, the semiconductor layers 114 are spaced from one another by sacrificial layers 116 which comprise at least one material that can be selectively etched with regards to the semiconductor material of the layers 114, with the thickness of the sacrificial layers 116 here being equal to the height, or the thickness, $H_{HK}$ desired for the portions of dielectric material 108.

The stack of layers therefore corresponds here to an alternating stack of N semiconductor layers 114 and of (N−1) sacrificial layers 116, with N an integer greater than or equal to 2. In the example described here, the semiconductor layers 114 comprise silicon, and the sacrificial layers 116 comprise SiGe. The concentration of germanium in the SiGe alloy of the sacrificial layers 116 is for example equal to about 20%, 30% or encore 45%. The higher this concentration in germanium in the SiGe of the sacrificial layers 116 is, the higher the etching selectivity with regards to the semiconductor layers 114 will be during the removal of the SiGe in order to form the semiconductor nanowires 104. This stack of semiconductor layers 114 and of sacrificial layers 116 can be obtained via the implementation of steps of epitaxy.

Figure 3A:
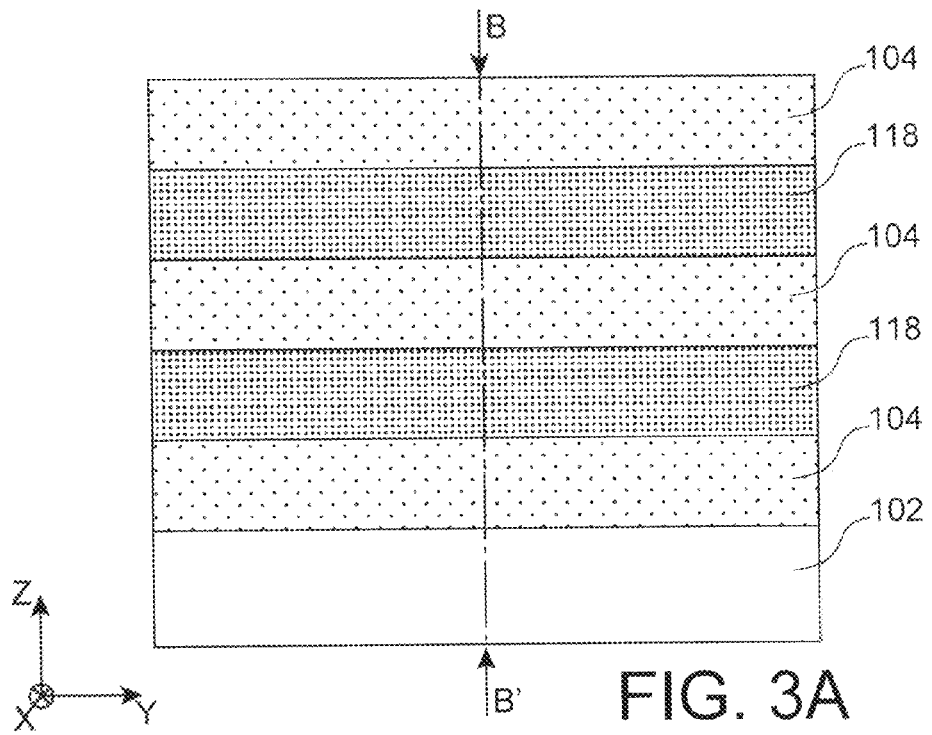
Figure 3B:
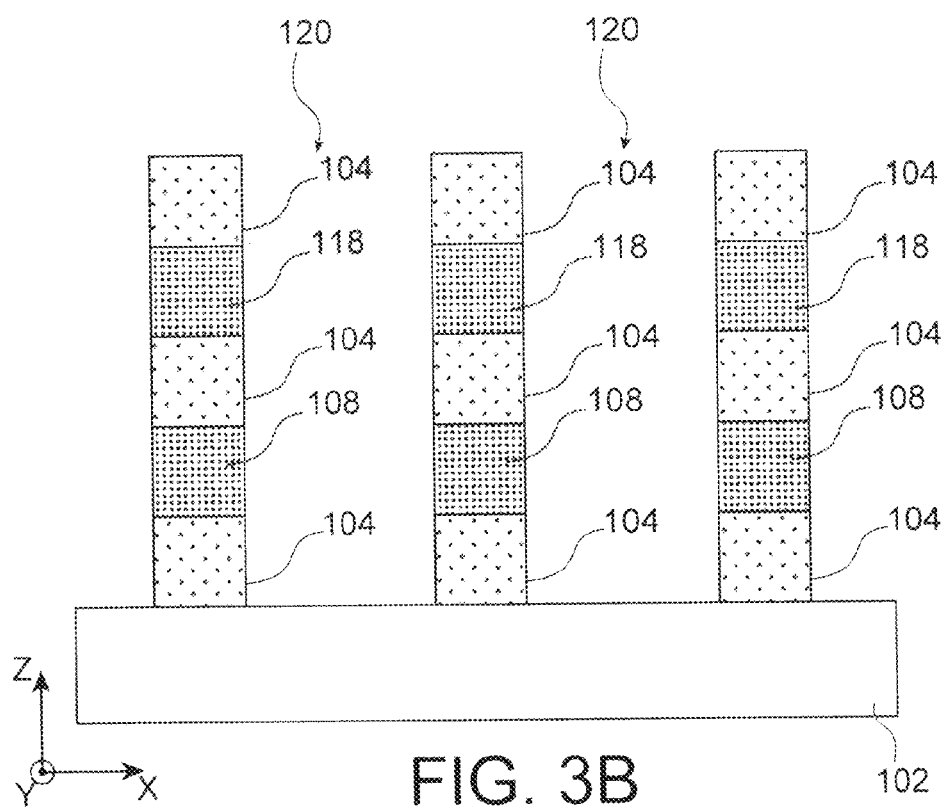

A step of etching, here a dry anisotropic etching, the stack of layers 114, 116 is then implemented so that the remaining portions of the semiconductor layers form the semiconductor nanowires 104. The sacrificial layers 116 and the semiconductor layers 114 are etched according to the same pattern. As such, the nanowires 104 superimposed one on top of the other and intended to be a part of the same semiconductor device 100 are spaced one from the other by remaining portions 118 of sacrificial layers 116, with each of these remaining portions 118 being in contact with the two semiconductor nanowires 104 between which the remaining portion 118 is arranged. This step of etching as such forms empty spaces 120 in the stack intended to delimit and separate the various semiconductor devices 100 from one another. FIGS. 3A and 3B show respectively a profile cross-section view and a front cross-section view (according to the axis BB' shown in FIG. 3A) of the stack after the implementation of this step of etching.

This step of etching can be preceded by a step of lithography wherein the pattern to be etched in the stack of layers 114, 116 is defined by a mask formed on this stack of layers 114, 116. Advantageously and when the semiconductor devices 100 are intended to be carried out with a high density on the support, this mask can be carried out via the implementation of a "spacer patterning" or "double patterning" method such as described hereinabove in the prior art part.

Figure 4A:
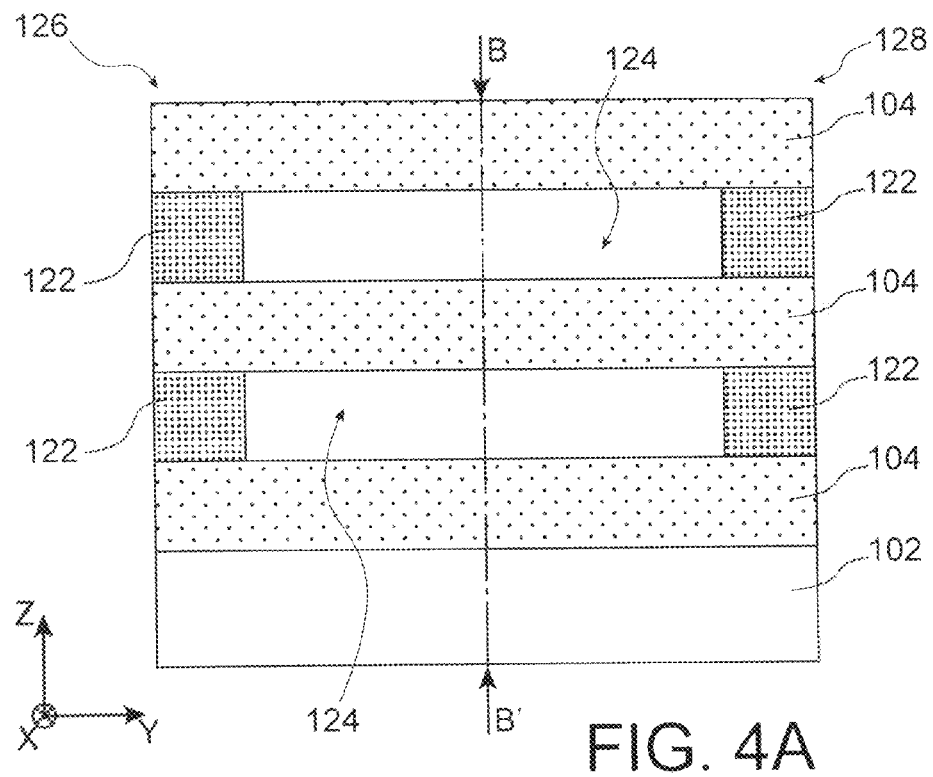
Figure 4B:
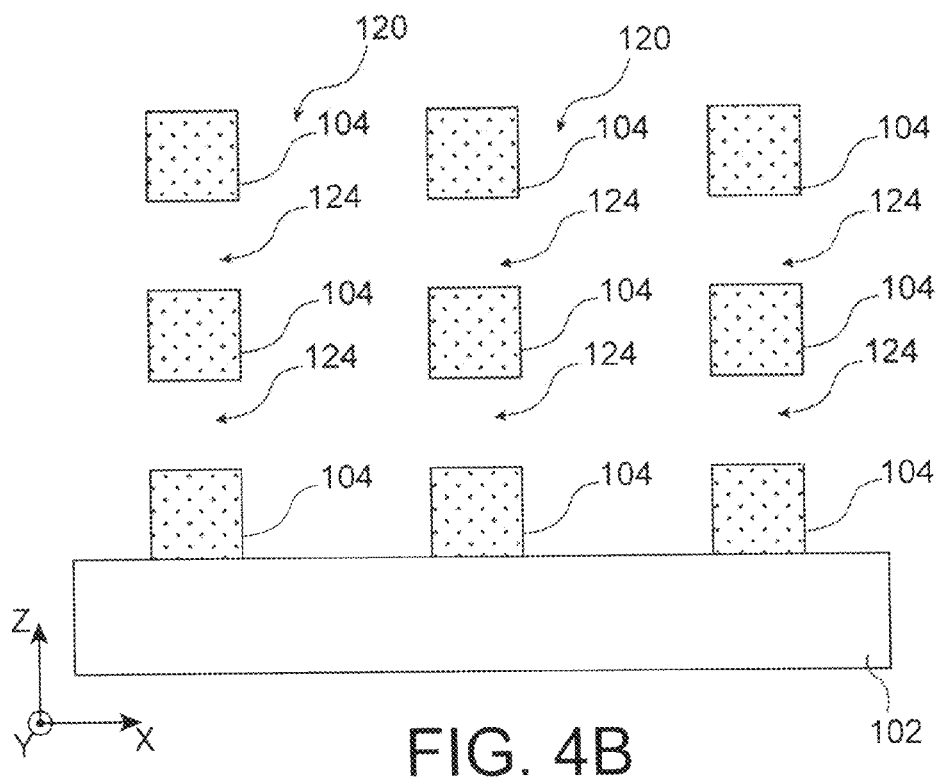

As shown in FIGS. 4A and 4B, the part of the remaining portions 118 of sacrificial material located between the semiconductor nanowires 104 are removed via a selective etching with respect to the semiconductor of the nanowires 104, for example of the $CF_4/N_2/Ar$ plasma type. Only the sacrificial material of the remaining portions 118 located at channels intended to be formed by the nanowires 104 is etched, so that the remaining parts 122 of the portions 118 of SiGe provide the maintaining of the nanowires 104 at the source and drain regions referenced as 126 and 128. This step of etching forms, between the nanowires 104 superimposed one on top of the other, free spaces 124 of which the dimensions and the shape correspond to those of the portions of etched sacrificial material and correspond to those of the dielectric structures intended to be carried out between the semiconductor nanowires 104.

The dielectric interface layers 106 are then carried out, for example by depositing, around semiconductor nanowires 104 (see FIGS. 5A and 5B). A part of the free spaces 124 are filled by a part of the dielectric structures intended to be interposed between the semiconductor nanowires 104, with this part of the dielectric structures corresponding to the portions of the dielectric interface layers 106 arranged between the superimposed semiconductor nanowires 104. When these dielectric interface layers 106 comprise semiconductor oxide, for example $SiO_2$, these dielectric interface layers 106 can be carried out by oxidation (for example of the plasma type, forming a deposit) of the semiconductor surface of the semiconductor nanowires 104.

A dielectric material with strong dielectric permittivity (relative permittivity greater than 3.9) is then deposited in all of the empty spaces formed previously in the stack of layers, i.e. in the free spaces 124 located between the superimposed semiconductor nanowires 104 as well as in the free spaces 120 that separate the semiconductor nanowires 104 from the various semiconductor devices 100. The dielectric material deposited is then etched in order to retain only the portions of dielectric material located between the superimposed semiconductor nanowires 104 of the same semiconductor device 100, as such forming the portions of dielectric material 108 (see FIGS. 6A and 6B). On their ends, the portions of dielectric material 108 are juxtaposed with the source and drain regions 126, 128, and are in contact with source and drain regions extension zones located between the channel regions formed by the semiconductor nanowires 104 and the source and drain regions 126, 128. The portions of dielectric material 108 can also be in contact with the source and drain regions 126, 128.

The gate dielectric 110 and the gate 112 are then carried out via depositing on all of the structure obtained previously, then by etching the parts of the materials of the gate dielectric 110 and of the gate 112 that do not cover the upper faces and the sidewalls of the stacks of the semiconductor nanowires 104, of the dielectric interface layers 106 and of the portions of dielectric material 108. The semiconductor devices 100 obtained correspond to those shown in FIG. 1.

Figure 6A:
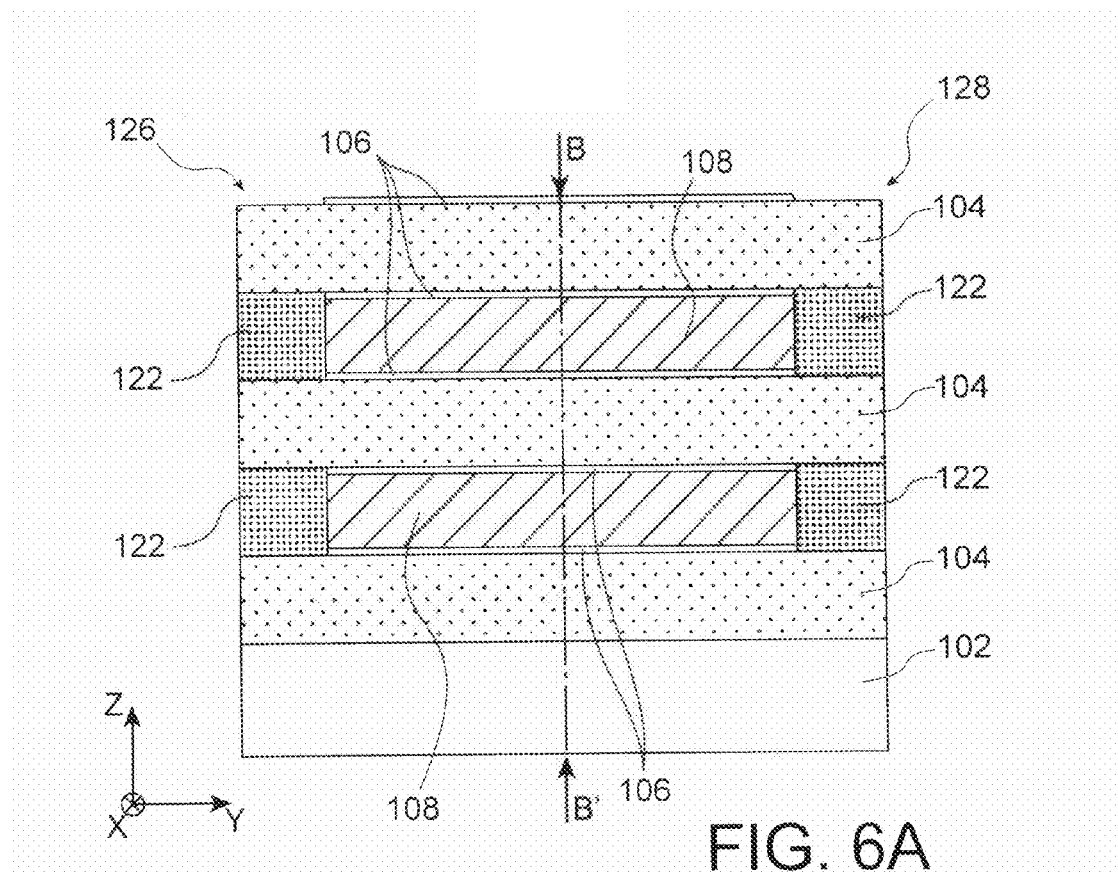
Figure 6B:
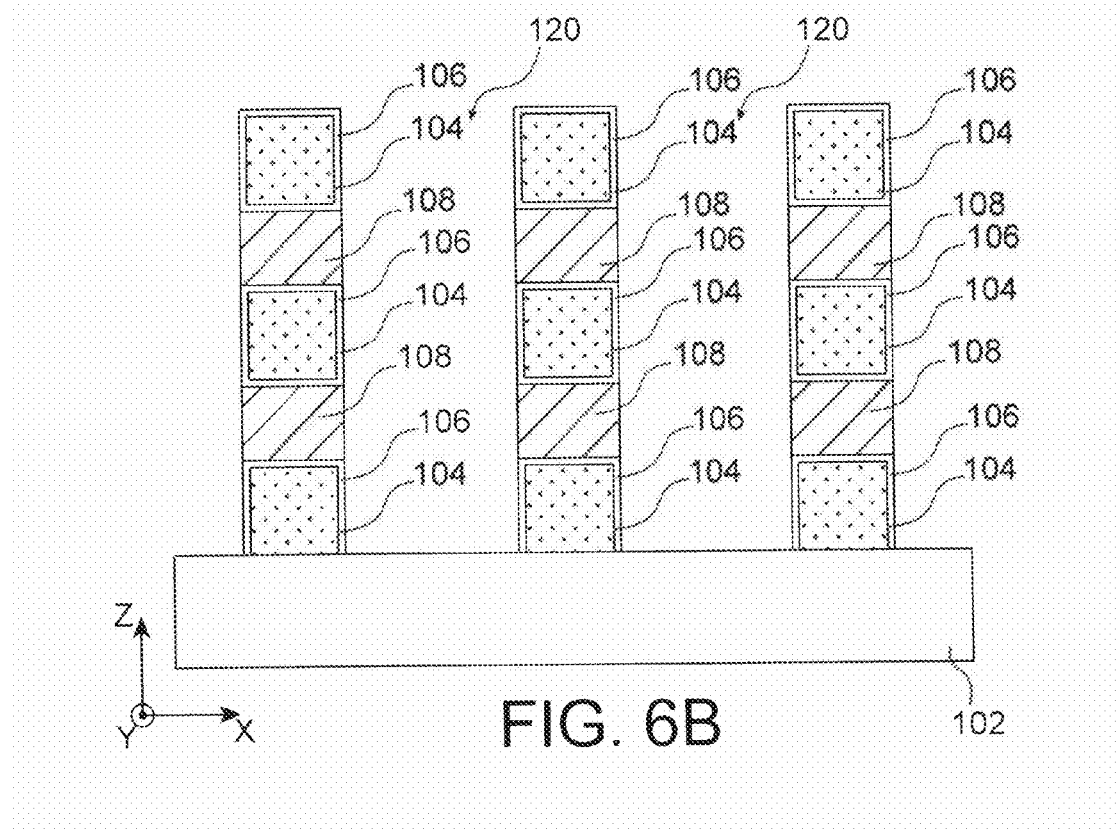

According to an alternative embodiment, when the semiconductor nanowires 104 are not surrounded by the dielectric interface layers 106, the step described previously in relation with FIGS. 5A and 5B is not implemented, the dielectric material deposited and etched during the step described in relation with FIGS. 6A and 6B and intended to form the portions 108 then being in direct contact with the semiconductor nanowires 104.

The alternative according to which the portions of dielectric material 108 are not as wide as the nanowires 104 can be obtained via the implementation of a slight over-etching, for example of the humid type, of the dielectric portions 108, with this over-etching being carried out before the depositing and the etching of the gate dielectric 110 and of the gate 112.

In relation with FIGS. 8A to 13C, the steps of a method for carrying out a semiconductor device 100 according to a second embodiment shall now be described, the device 100 corresponding here to a transistor of the FET type comprising nanowires arranged next to one another and spaced one from the other.

Figure 8A:
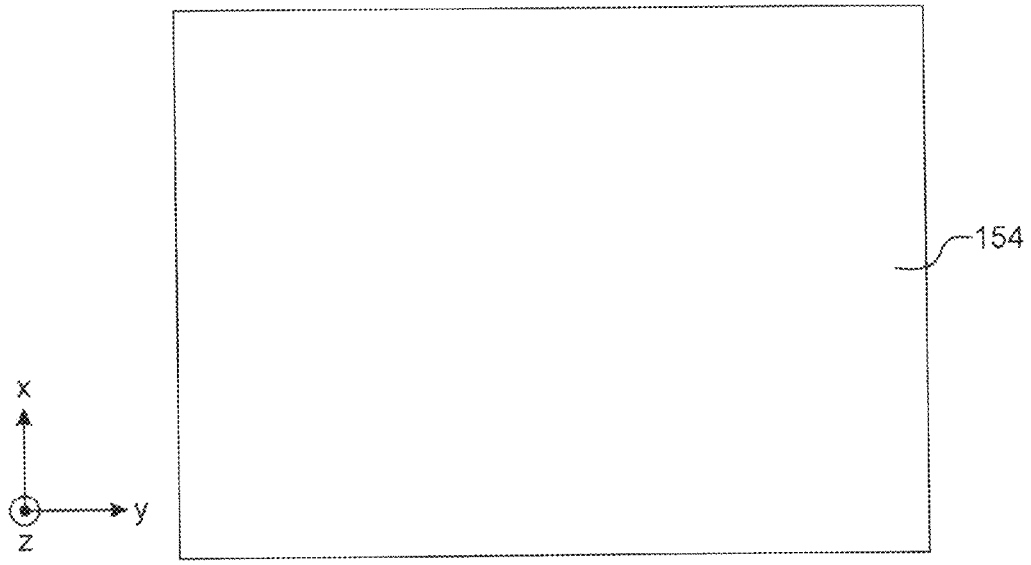
FIGS. 8A to 13C show the steps of a method for carrying out a semiconductor device according to a second embodiment.
Figure 8B:
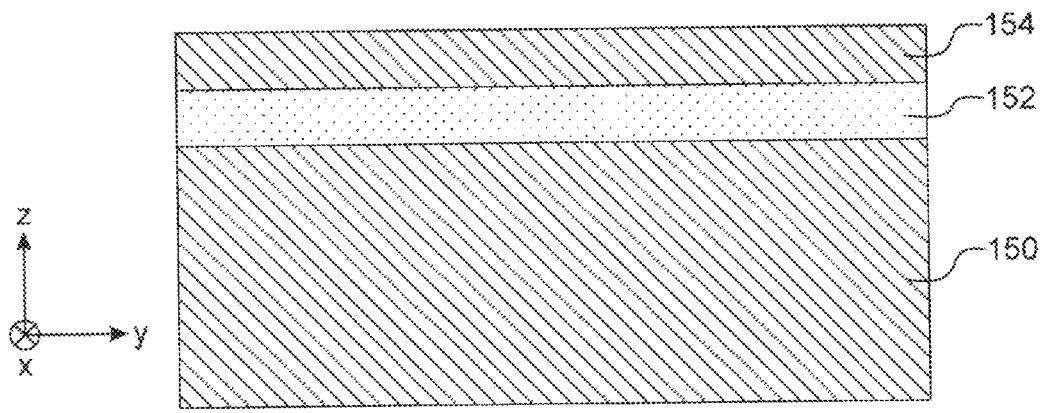

This semiconductor device 100 is carried out using a substrate of the semiconductor on insulator type, for example SOI (silicon on insulator), i.e. comprising a massive semiconductor layer 150, comprising for example silicon and a thickness equal to several hundreds of microns, whereon is arranged a buried dielectric layer 152 (called BOX or "Buried Oxide") comprising a dielectric material such as $SiO_2$ and a thickness between a few nanometers and a few tens of nanometers, and a superficial layer 154, comprising a semiconductor material such as silicon, germanium, SiGe, or any III-V semiconductor, and arranged on the buried dielectric layer 152. The thickness of the superficial layer 154 (dimension according to the axis Z) is advantageously chosen as being equal to the thickness desired for the nanowires 104 intended to be carried out using the superficial layer 154. This thickness is for example between about 5 nm and 30 nm, or between about 10 nm and 12 nm. FIG. 8A shows a top view of the substrate and FIG. 8B shows a side cross-section view of this substrate. In this second embodiment, the buried dielectric layer 152 is intended to be used as a sacrificial layer for the carrying out of the nanowires 104.

Figure 9A:
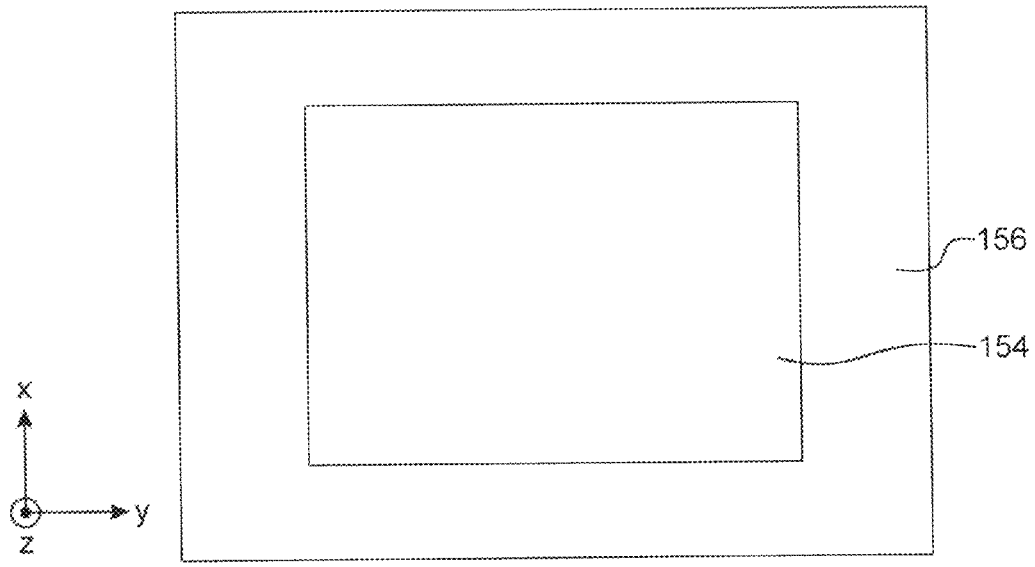
Figure 9B:
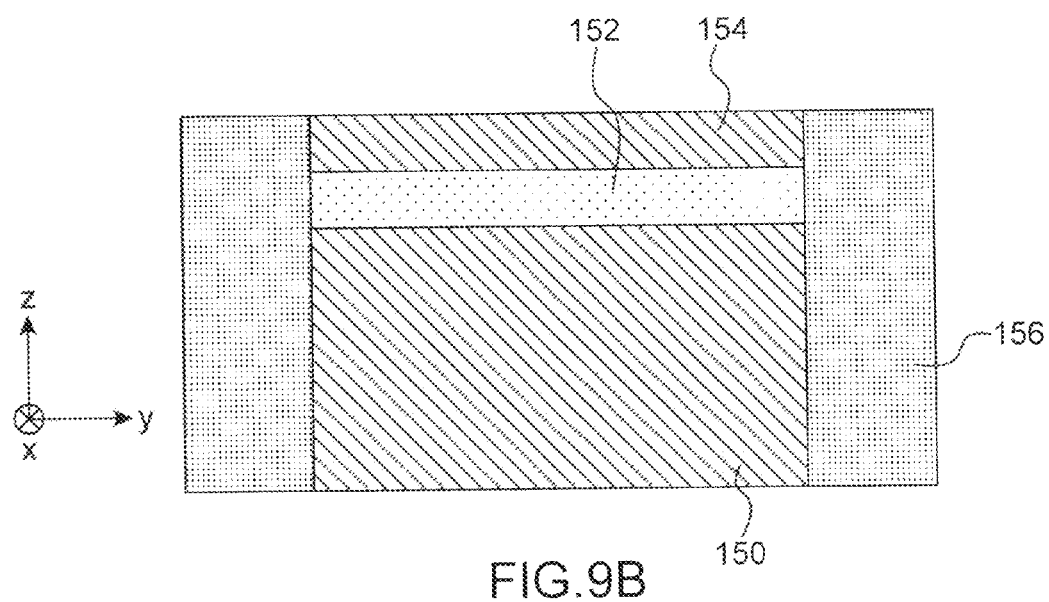

As shown in FIGS. 9A and 9B (FIG. 9A shows a top view of the substrate and FIG. 9B shows a side cross-section view of this substrate), shallow isolation trenches 156, also referred to as STI for "Shallow Trench Isolation" are carried out through the layers 150, 152 and 154 of the substrate, as such delimiting the active zone of the device 100 in the substrate. These trenches 156 are carried out by etching trenches through the layers 154 and 152 and in a part of the thickness of the massive layer 150. A dielectric material such as SiO$_2$ is then deposited in the etched trenches.

Figure 10A:
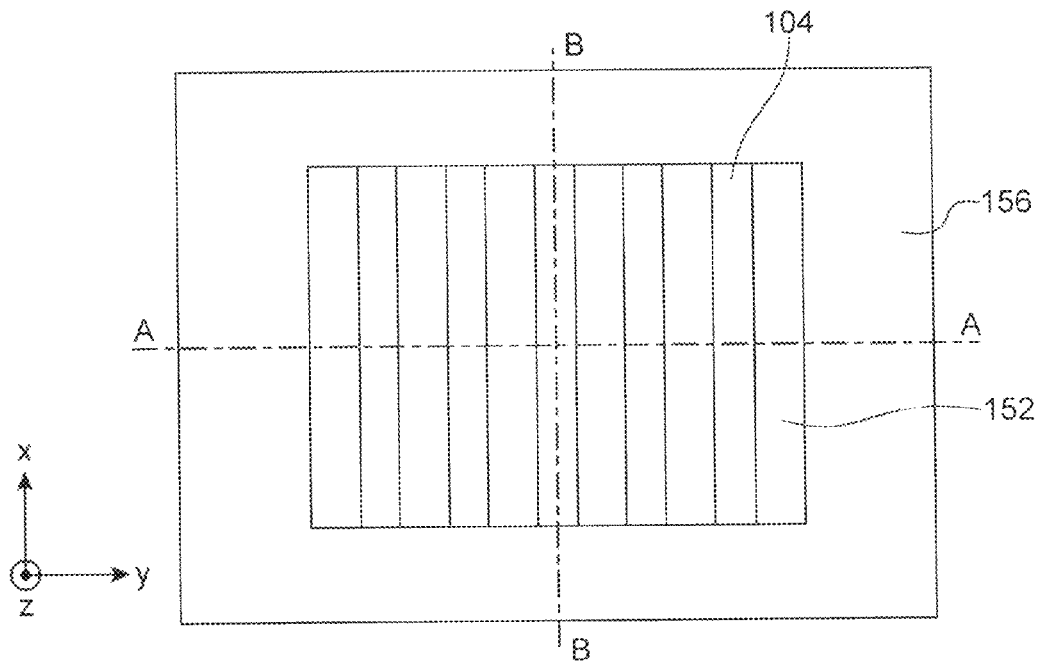
Figure 10B:
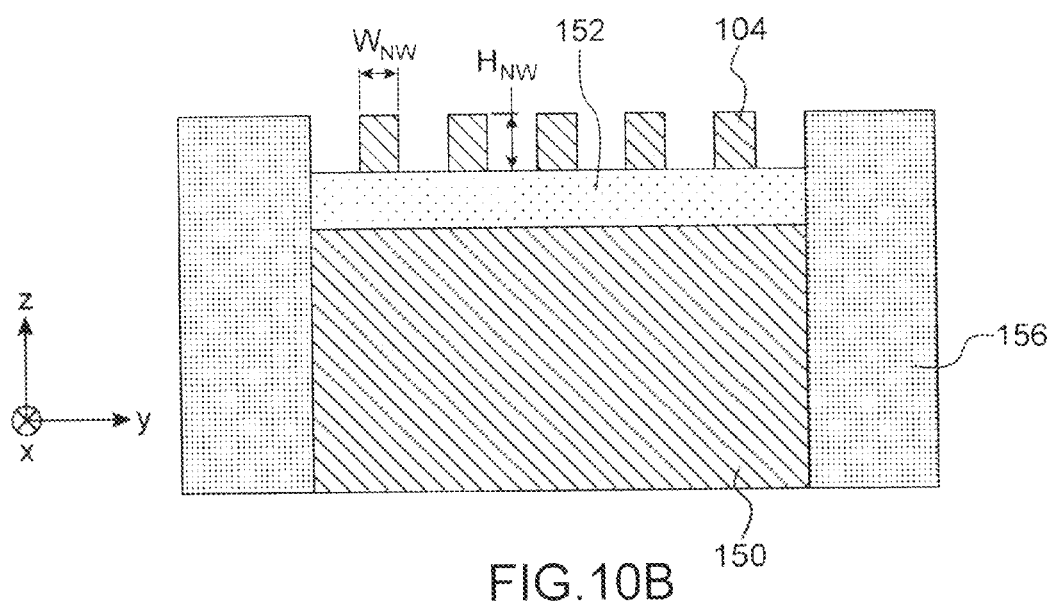
Figure 10C:
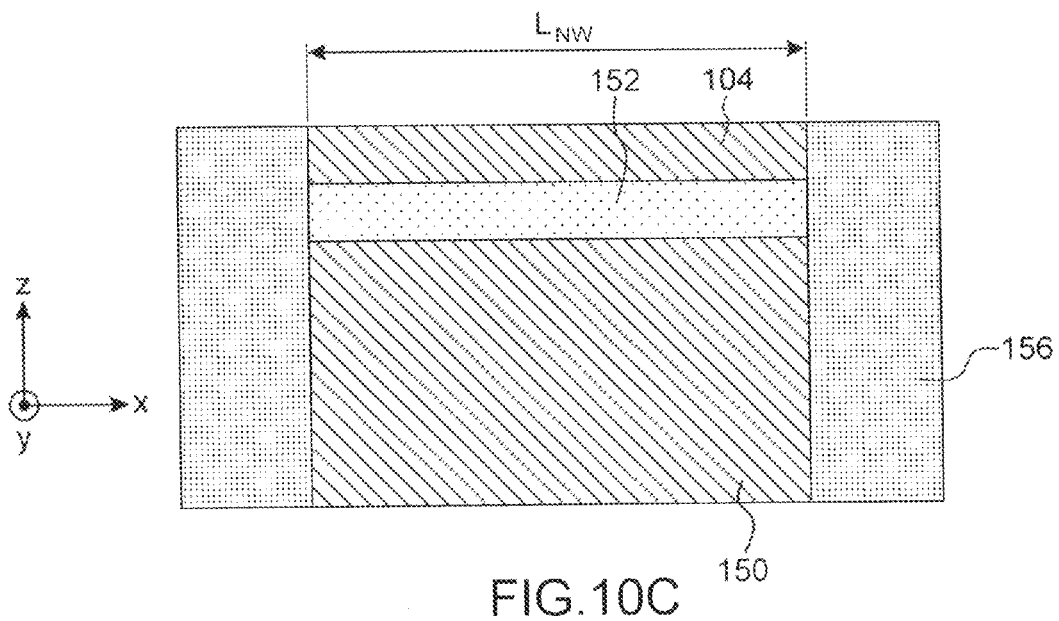

The semiconductor nanowires 104 are then carried out by etching through the superficial layer 154. FIG. 10A shows a top view of the structure obtained, and FIGS. 10B and 10C show cross-section views of the structure obtained respectively according to the axes AA and BB that can be seen in FIG. 10A. The dimensions $W_{NW}$, $H_{NW}$ and $L_{NW}$ of the nanowires 104 are for example equal to those described hereinabove in relation with the first embodiment. In addition, the spacing between two nanowires 104 arranged next to one another is for example similar to the spacing between two nanowires superimposed one on top of the other as described previously in relation with the first embodiment.

Figure 11A:
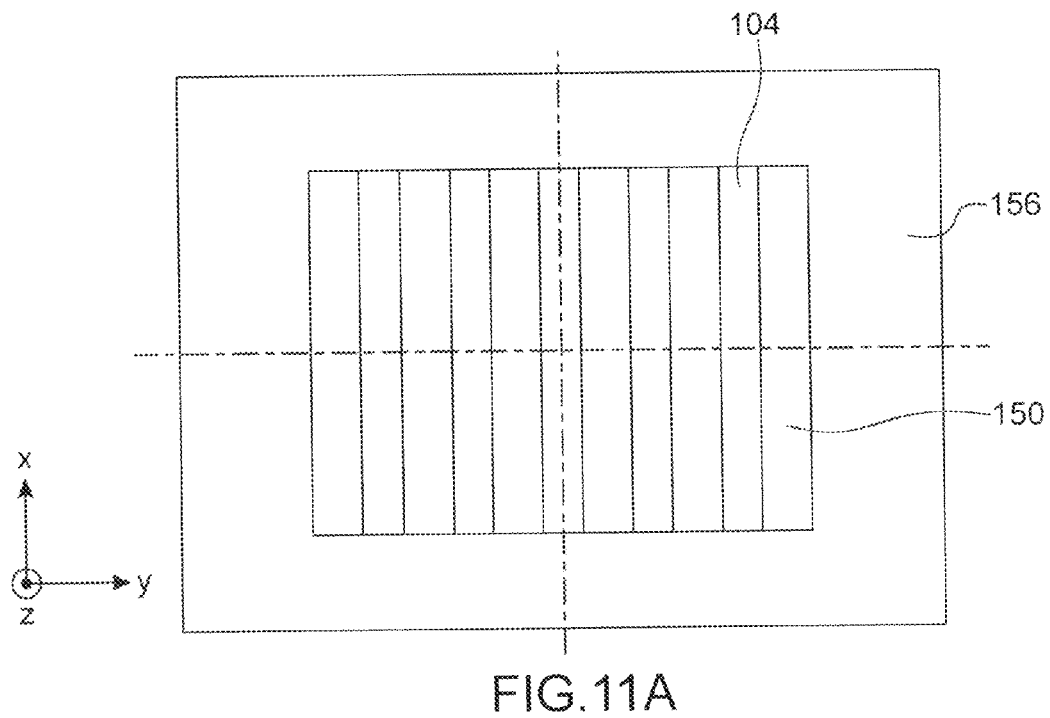
Figure 11B:
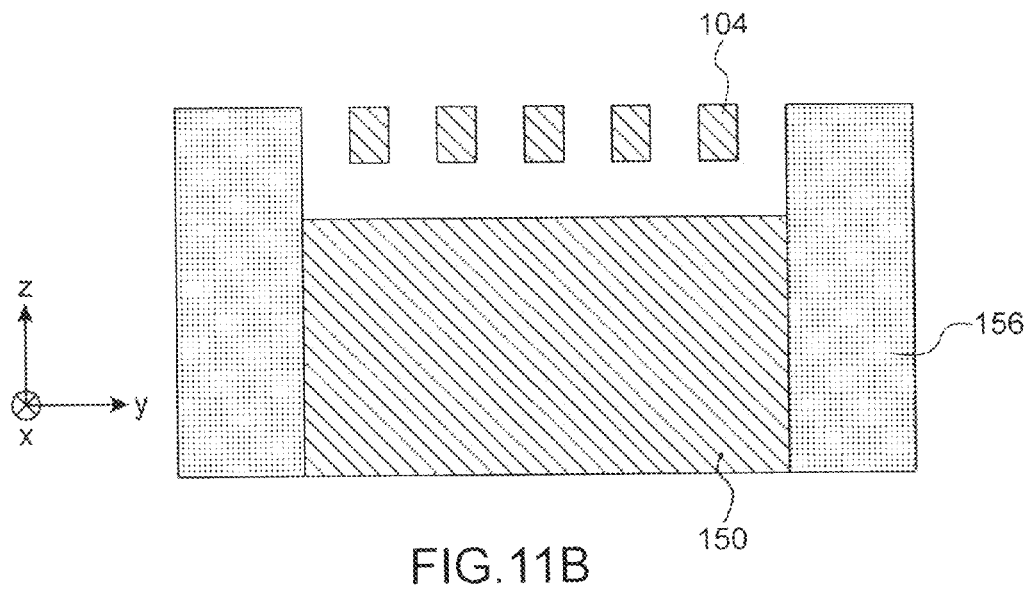
Figure 11C:
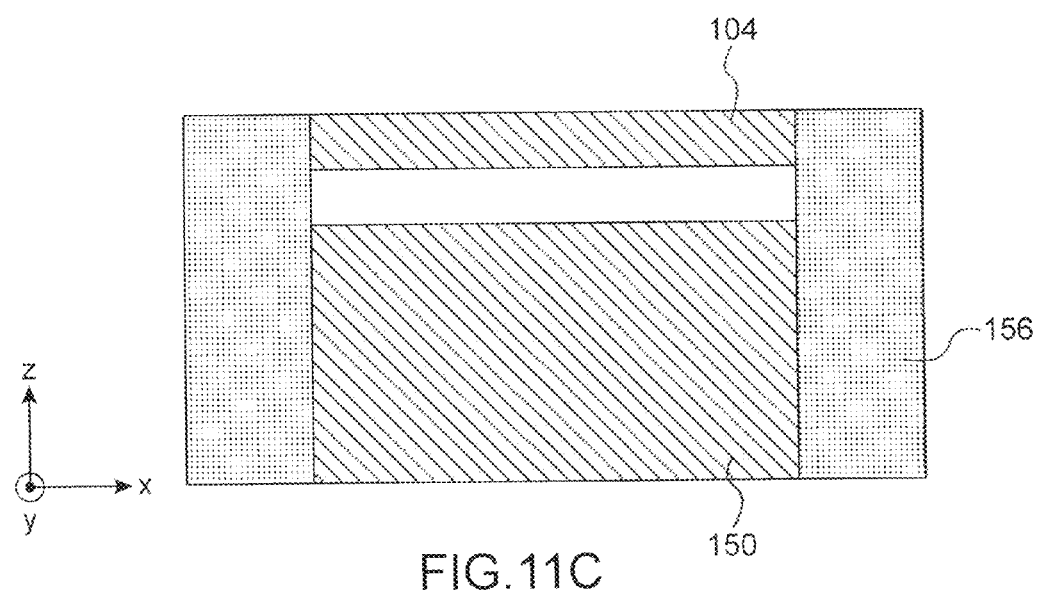

The buried dielectric layer 152 is then suppressed, for example by etching (see FIGS. 11A to 11C). The nanowires 104 are then suspended and maintained at their ends by anchoring to the trenches 156.

Figure 12A:
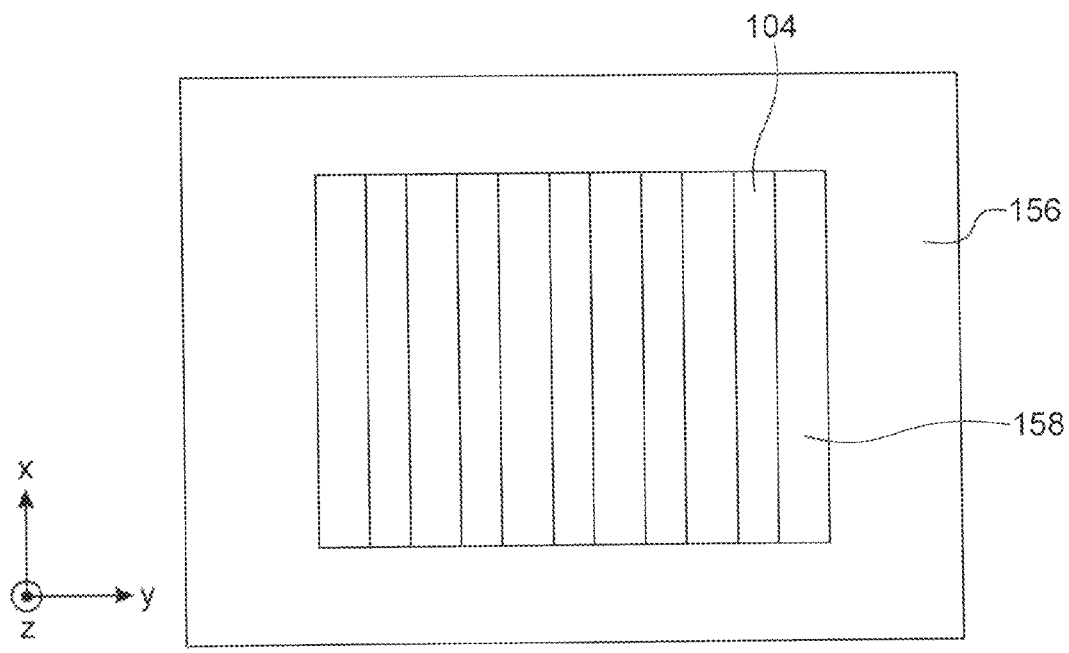
Figure 12B:
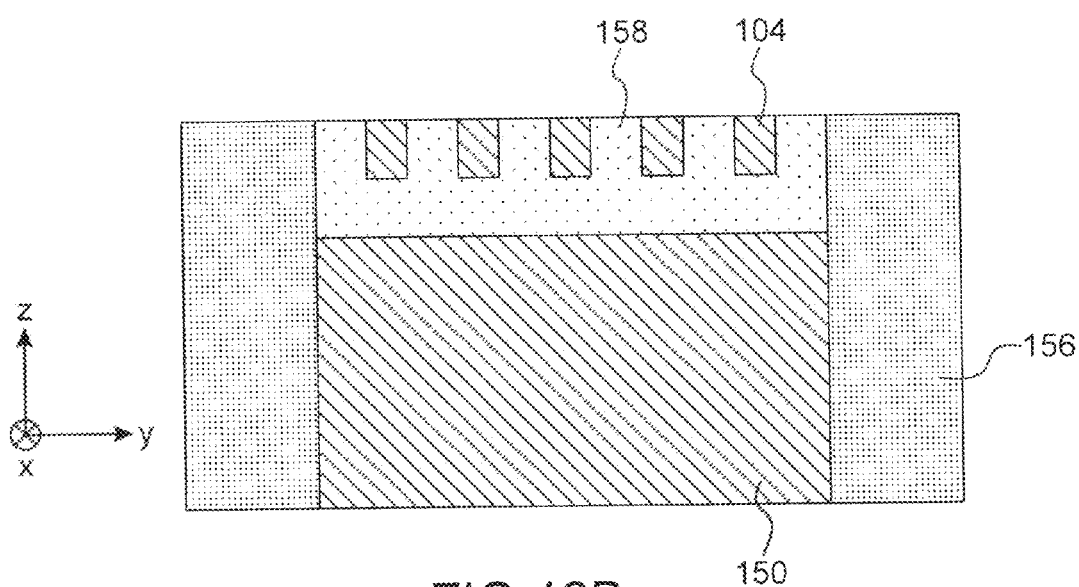
Figure 12C:
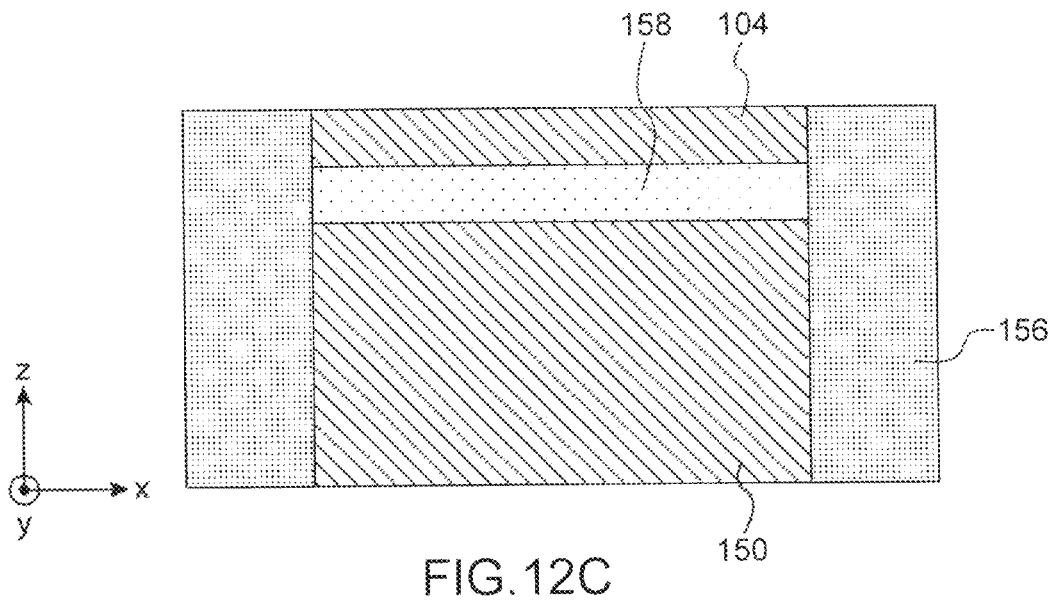

As shown in FIGS. 12A to 12C, the space located under the nanowires 104, previously occupied by the buried dielectric layer 152, as well as the spaces between the nanowires 104 are then filled by a deposit of dielectric material 158, for example of the oxide and/or a dielectric material with strong permittivity ("High-K"). The dielectric material 158 can correspond to one of the examples of materials described hereinabove for the portions of dielectric material 108.

Figure 13A:
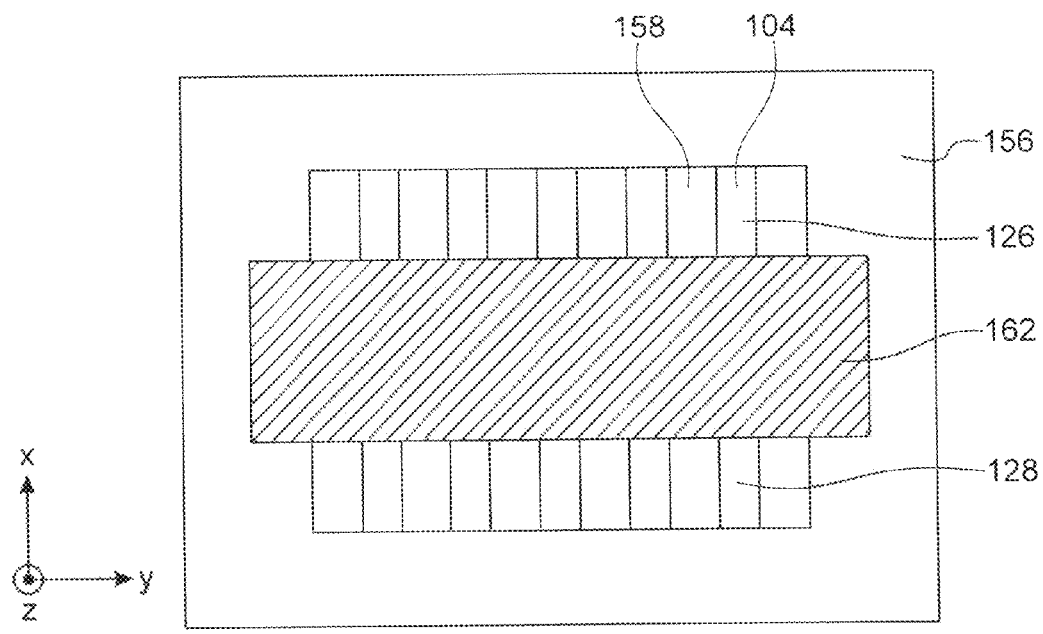
Figure 13B:
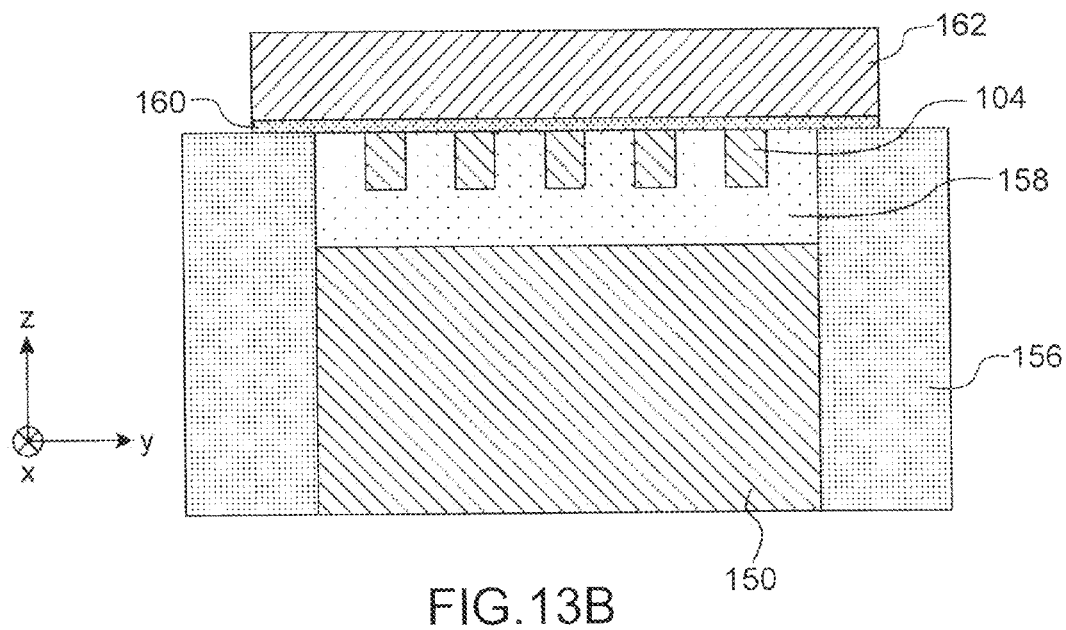
Figure 13C:
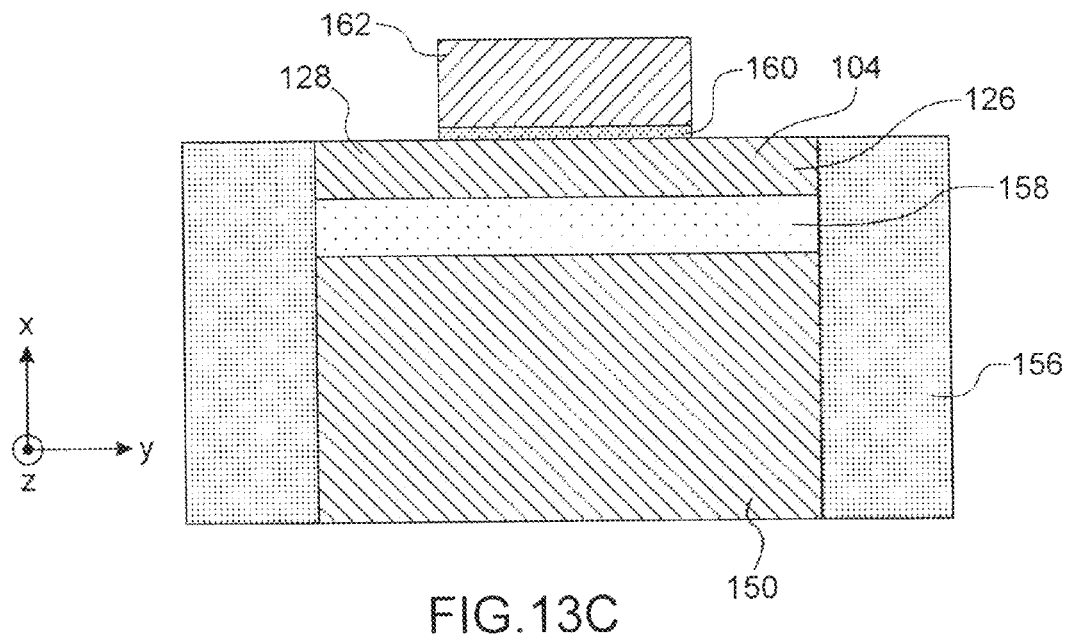

The device 100 is then completed by carrying out on the previously carried out structure a gate dielectric 160 and a gate 162 arranged on the parts of the nanowires 104 intended to form the channels of the device 100 (FIGS. 13A to 13C). The gate dielectric 160 and the gate 162 are arranged on a part of the upper faces of the nanowires 104 and on a part of an upper face of the dielectric material 158. The ends of the gate dielectric 160 and of the gate 162 rest on the trenches 156. The portions of the nanowires 104 that are not covered by the gate dielectric 160 and the gate 162 form the source 126 and drain 128 regions of the device 100. The gate dielectric 160 correspond for example to a portion of dielectric material with a strong relative permittivity (greater than 3.9), comprising for example HfO$_2$ and a thickness equal to about 2.5 nm. The gate 162 comprises for example a metal material such as TiN.

The various advantages described hereinabove for the first embodiment are also found in the device 100 according to this second embodiment.

The permittivity of the dielectric material 158 arranged under and between the nanowires 104 is advantageously greater than or equal to 20. As such, the device 100 comprises a planar gate 162 with an electrical behaviour close to a GAA structure car the electric field lines are going to be able to easily penetrate into this dielectric material 158.

Such a structure makes it possible to obtain an electrostatic behaviour that is close to a transistor of the GAA type while still retaining a gate etching that is simple to carry out.

As in the first embodiment described hereinabove, the sections of the nanowires 104 of the device according to the second embodiment can be of a square shape as in the embodiment described in relation with FIGS. 8A to 13C, or of a different shape.

It is also possible that the nanowires 104, or some of the nanowires 104, of the device 100 according to the second embodiment each be surrounded by an dielectric interface layer 106 as described hereinabove for the first embodiment. In this case, the dielectric material 158 is arranged around the dielectric interface layers 106 (except on the upper face of the nanowires 104 which is arranged on the side of the gate dielectric 160 and of the gate 162).

The various alternatives and possibilities for carrying out described hereinabove in relation with the first embodiment also apply to this second embodiment.

The invention claimed is:

1. A semiconductor device, comprising:
   at least two semiconductor nanowires superimposed one on top of the other or arranged next to one another, spaced one from the other and forming channel regions of the semiconductor device;
   a dielectric structure entirely filling a space extending between the at least two semiconductor nanowires and which is in contact with the at least two semiconductor nanowires; and
   a gate dielectric and a gate covering at least a first of the at least two semiconductor nanowires, sidewalls of the two semiconductor nanowires, and sidewalls of the dielectric structure when the at least two semiconductor nanowires are superimposed one on top of the other, or covering a part of the upper faces of the at least two semiconductor nanowires and a part of an upper face of the dielectric structure when the at least two semiconductor nanowires are arranged next to one another,
   wherein the dielectric structure comprises at least one portion of dielectric material with a relative permittivity greater than or equal to 20, and
   wherein the at least two semiconductor nanowires are arranged next to one another such that a part of the dielectric structure is arranged under the at least two semiconductor nanowires and between the at least two semiconductor nanowires.

2. The semiconductor device according to claim 1, wherein the semiconductor nanowires are parallel with respect to one another.

3. The semiconductor device according to claim 2, wherein each semiconductor nanowire comprises, in a plane perpendicular to a direction according to which the semiconductor nanowires extend, a section of rectangular shape.

4. The semiconductor device according to claim 1, wherein each semiconductor nanowire is surrounded by a dielectric interface layer, the dielectric structure further comprising portions of the dielectric interface layers arranged between the semiconductor nanowires and in contact with the at least one portion of dielectric material.

5. The semiconductor device according to claim 1, further comprising at least one additional semiconductor nanowire in addition to the two semiconductor nanowires, said at least one additional semiconductor nanowire and the two semiconductor nanowires being superimposed one on top of another; and at least one additional dielectric structure in addition to the dielectric structure,
   wherein two adjacent semiconductor nanowires are spaced one from the other by one of the dielectric structures extending between said two adjacent semiconductor nanowires and in contact with said two adjacent semiconductor nanowires, and
   wherein the gate dielectric and the gate also cover sidewalls of the at least one additional semiconductor nanowire and sidewalls of the at least one additional dielectric structure.

6. The semiconductor device according to claim 1, further comprising source and drain regions between which extend the semiconductor nanowires or formed by parts of semiconductor nanowires, with the dielectric structure being in contact with the source and drain regions and/or juxtaposed with the source and drain regions.

7. A semiconductor device, comprising:
   at least two semiconductor nanowires superimposed one on top of the other or arranged next to one another, spaced one from the other and forming channel regions of the semiconductor device;
   a dielectric structure entirely filling a space extending between the at least two semiconductor nanowires and which is in contact with the at least two semiconductor nanowires; and
   a gate dielectric and a gate covering at least a first of the at least two semiconductor nanowires, sidewalls of the two semiconductor nanowires, and sidewalls of the dielectric structure when the at least two semiconductor nanowires are superimposed one on top of the other, or covering a part of the upper faces of the at least two semiconductor nanowires and a part of an upper face of the dielectric structure when the at least two semiconductor nanowires are arranged next to one another,
   wherein the dielectric structure comprises at least one portion of dielectric material with a relative permittivity greater than or equal to 20, and
   wherein each semiconductor nanowire is surrounded by a dielectric interface layer, the dielectric structure further comprising portions of the dielectric interface layers arranged between the at least two semiconductor nanowires and in contact with the at least one portion of dielectric material.

* * * * *